United States Patent
Moslehi Bajestan et al.

(10) Patent No.: US 11,595,028 B2
(45) Date of Patent: Feb. 28, 2023

(54) FREQUENCY DOUBLER WITH DUTY CYCLE CORRECTION

(71) Applicant: Qualcomm Incorporated, San Diego, CA (US)

(72) Inventors: Masoud Moslehi Bajestan, San Diego, CA (US); Marco Zanuso, Encinitas, CA (US); Razak Hossain, San Diego, CA (US); Hasnain Lakdawala, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/362,509

(22) Filed: Jun. 29, 2021

(65) Prior Publication Data

US 2021/0409007 A1    Dec. 30, 2021

Related U.S. Application Data

(60) Provisional application No. 63/046,659, filed on Jun. 30, 2020.

(51) Int. Cl.
  *H03K 3/017* (2006.01)
  *H03L 7/093* (2006.01)
  *H01Q 1/24* (2006.01)

(52) U.S. Cl.
  CPC ............. *H03K 3/017* (2013.01); *H03L 7/093* (2013.01); *H01Q 1/243* (2013.01)

(58) Field of Classification Search
  CPC ..... H03L 7/06; H03L 7/07; H03L 7/08; H03L 7/0802; H03L 7/0805; H03L 7/0807; H03L 7/081; H03L 7/0812; H03L 7/0814; H03L 7/0816; H03L 7/0818; H03L 7/083; H03L 7/093; H03L 7/095; H03L 7/10;
  (Continued)

(56) References Cited

U.S. PATENT DOCUMENTS

| | | | | |
|---|---|---|---|---|
| 8,269,530 B2 * | 9/2012 | Tao | ..................... | H03K 5/1534 327/119 |
| 8,988,121 B2 * | 3/2015 | Terrovitis | .................. | H03L 7/23 327/158 |

(Continued)

OTHER PUBLICATIONS

Elkholy A., et al., "A 2.5-5.75-GHz Ring-Based Injection-Locked Clock Multiplier With Background-Calibrated Reference Frequency Doubler", IEEE Journal of Solid-State Circuits, vol. 54, No. 7, Jul. 2019, pp. 2049-2058.

*Primary Examiner* — Diana J. Cheng
(74) *Attorney, Agent, or Firm* — Colby Nipper; QUALCOMM Incorporated

(57) ABSTRACT

An apparatus can implement a frequency doubler with duty cycle correction in conjunction with, for instance, a phase-locked loop (PLL) to decrease phase noise. In an example aspect, an apparatus has a frequency doubler including a signal combiner, a first signal pathway, and a second signal pathway. The frequency doubler also includes a doubler input node and a doubler output node. The signal combiner is coupled to the doubler output node. The first signal pathway is coupled between the doubler input node and the signal combiner and includes a first adjustable delay cell. The second signal pathway is also coupled between the doubler input node and the signal combiner and includes a second adjustable delay cell.

30 Claims, 13 Drawing Sheets

(58) Field of Classification Search
CPC . H03L 7/104; H03L 7/105; H03L 7/22; H03L 7/24
See application file for complete search history.

(56) References Cited

U.S. PATENT DOCUMENTS 9,985,618 B2  5/2018  Park et al.
2017/0187364 A1* 6/2017  Park ..................... H04L 7/0331

* cited by examiner

FREQUENCY DOUBLER WITH DUTY CYCLE CORRECTION

CROSS-REFERENCE TO RELATED APPLICATION

This application claims the benefit of U.S. Provisional Application No. 63/046,659, filed 30 Jun. 2020, the disclosure of which is hereby incorporated by reference in its entirety herein.

TECHNICAL FIELD

This disclosure relates generally to electronic devices and, more specifically, to frequency generation using a frequency doubler with duty cycle correction.

BACKGROUND

Electronic devices include traditional computing devices, such as desktop computers, notebook computers, smartphones, wearable devices like a smartwatch, internet servers, and so forth. However, electronic devices also include other types of computing devices, such as personal voice assistants, programmable thermostats, automotive electronics, robotics, medical equipment, intelligent devices embedded in other machines such as refrigerators and industrial tools, Internet-of-Things (IoT) devices, and the like. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those exchanged between or among separate or remote electronic devices using wireless or wired signals that are transmitted over one or more networks, such as the Internet or a cellular network. Electronic communications can also include those exchanged between or among different printed circuit boards, modules, chips, or even cores or other circuit portions of a given integrated circuit that are located within a housing of a single electronic device. Regardless, electronic communications are usually accomplished by generating or propagating electrical or electromagnetic signals. Such electronic communications are typically made using at least one signal that is designed to have a specified characteristic, such as a particular frequency. Generally, the signals of electronic communications are more likely to be correctly transmitted and received, as well as properly interpreted, if the specified characteristic is accurately and reliably produced.

With regard to a frequency characteristic of a signal, a frequency synthesizer can be used to create, or synthesize, a desired frequency. Thus, electronic devices employ frequency synthesizers to synthesize signals having desired frequencies. Typically, a frequency synthesizer includes a frequency generator, such as a locked loop (LL). Examples of locked loops include a phase-locked loop (PLL) and a delay-locked loop (DLL). In operation, a locked loop receives a reference signal having a reference frequency and applies the reference signal to a loop with a feedback control mechanism. Using a feedback loop, the circuitry of the locked loop generates an output signal that oscillates at a desired frequency based at least on the reference frequency of the reference signal.

A locked loop of an electronic device therefore outputs an oscillating signal to provide some synthesized frequency. The electronic device can use the synthesized frequency of the oscillating signal in one or more stages of a communication scenario. Example stages for communicating a signal include generating, transmitting, receiving, and interpreting a communication signal. In an example signal-generation stage, a frequency generated by a locked loop can be used to modulate a communication signal. The modulation entails encoding or adding information—such as data representing a text and an associated photograph—to the communication signal or signals. In an example signal-transmission stage, a frequency generated by a locked loop can be employed to upconvert a frequency of a modulated communication signal using a mixer that is part of a transmit chain. With an up-conversion operation, the mixer increases a frequency of the communication signal. The increased frequency enables the communication signal to be transmitted wirelessly as a radio-frequency (RF) electromagnetic (EM) signal that travels through the air, e.g., between a smartphone and a cellular base station.

A locked loop can also be used with the stages of a reception side of a typical communication scenario. For example, a locked loop can be used to down-convert a frequency of a received communication signal using a mixer that is part of a receive chain. After frequency down-conversion, a locked loop can be used to demodulate the down-converted communication signal to interpret the signal and thereby recover encoded information—such as the text message and the associated photograph. Additionally, a locked loop can be used to generate a frequency for a clock signal that controls a rate of operation of clock-synchronized circuitry of an integrated circuit. Examples of an integrated circuit that may use a clock signal for synchronized operations include a system-on-chip (SoC), a modem baseband that processes a communication signal, and a graphics chip that processes video data that is being displayed to a user.

Thus, a locked loop can be employed in any of multiple stages of a communication scenario to support electronic communications with electronic devices. A locked loop can also be employed in a synchronously-operated circuit scenario to support coordinated interoperations among different components of electronic devices. Unfortunately, a degree to which a locked loop is both stable and accurate while generating a clean frequency can vary. This variability can adversely impact the electronic communications or coordinated interoperations that the locked loop is supporting. Consequently, electrical engineers and other designers of electronic devices strive to improve the functionality, stability, and output signals of the locked loops that are used to facilitate the electronic communications and high-speed synchronous operations of electronic devices.

SUMMARY

A locked loop, such as a phase-locked loop (PLL), uses an input signal to produce a locked-loop output signal having a desired signal characteristic. A frequency doubler may be used to increase a reference frequency of a reference signal provided by a reference signal source to produce a frequency-doubled signal for a locked-loop input. The increased frequency for the input signal can improve performance of the locked loop, such as by lowering phase noise. Duty cycle error in the reference signal, however, can introduce an even/odd period mismatch in the frequency-doubled signal for the locked-loop input, resulting in reference spurs in the locked-loop output signal. To address this period mismatch and at least reduce the size or effect of the reference spurs, the frequency doubler can institute duty cycle correction. The duty cycle correction can selectively delay a rising edge or a falling edge of the reference signal from the reference signal source to at least partially balance the even/odd periods in conjunction with doubling the reference frequency of the reference signal. This even/odd period balancing can reduce the occurrence of reference spurs at the output of the associated locked loop. The frequency doubler can also or alternatively share a phase detector, such as a bang-bang phase detector, between feedback for a voltage-controlled delay line of the frequency doubler and feedback to control an amount by which the rising edge or the falling edge is delayed. Sharing the phase detector can reduce a deterministic duty cycle error. In these manners, a frequency doubler can enable the locked-loop to have lower phase noise while at least reducing production of a substantial reference spur or an appreciable duty cycle error.

In an example aspect, an apparatus for frequency doubling with duty cycle correction is disclosed. The apparatus includes a frequency doubler with a signal combiner, a first signal pathway, and a second signal pathway. The signal combiner is coupled to a doubler output node. The first signal pathway is coupled between a doubler input node and the signal combiner, and the first signal pathway includes a first adjustable delay cell. The second signal pathway is coupled between the doubler input node and the signal combiner, and the second signal pathway includes a second adjustable delay cell.

In an example aspect, an apparatus for doubling a reference frequency of a reference signal is disclosed. The apparatus includes a frequency doubler. The frequency doubler includes first means for selectively delaying a rising edge of the reference signal and for producing a rising edge signal. The frequency doubler also includes second means for selectively delaying a falling edge of the reference signal and for producing a falling edge signal. The frequency doubler further includes combination means for combining the rising edge signal and the falling edge signal to produce a signal having a frequency approximately double the reference frequency.

In an example aspect, a method for operating a frequency doubler with duty cycle correction is disclosed. The method includes generating a frequency-doubled signal based on a reference signal. The method also includes determining a duty cycle error of the reference signal based on the frequency-doubled signal. The method further includes reducing at least one effect from the duty cycle error of the reference signal by selectively adjusting a delay of an edge of the reference signal. The reducing includes adjusting a delay of a rising edge of the reference signal or adjusting a delay of a falling edge of the reference signal.

In an example aspect, an apparatus includes a frequency doubler. The frequency doubler includes a frequency doubler core, a delay-locked loop (DLL), a controller circuit, and a phase detector. The frequency doubler core includes at least one adjustable delay cell. The DLL is coupled to the frequency doubler core. The controller circuit is coupled to the at least one adjustable delay cell. A first input of the phase detector is coupled to the frequency doubler core. A second input of the phase detector is coupled to the DLL. An output of the phase detector is coupled to an input of the DLL and an input of the controller circuit.

BRIEF DESCRIPTION OF DRAWINGS

FIG. 3-1 illustrates example frequency-doubling circuitry with associated signal waveforms.

FIG. 3-2 illustrates example frequency-doubling circuitry, including a falling-edge delay circuit, with associated signal waveforms.

FIG. 3-3 illustrates example frequency-doubling circuitry, including a rising-edge delay circuit, with associated signal waveforms.

FIG. 5-1 illustrates example duty cycle sensing logic of example DCC circuitry.

DETAILED DESCRIPTION

Figure 1:
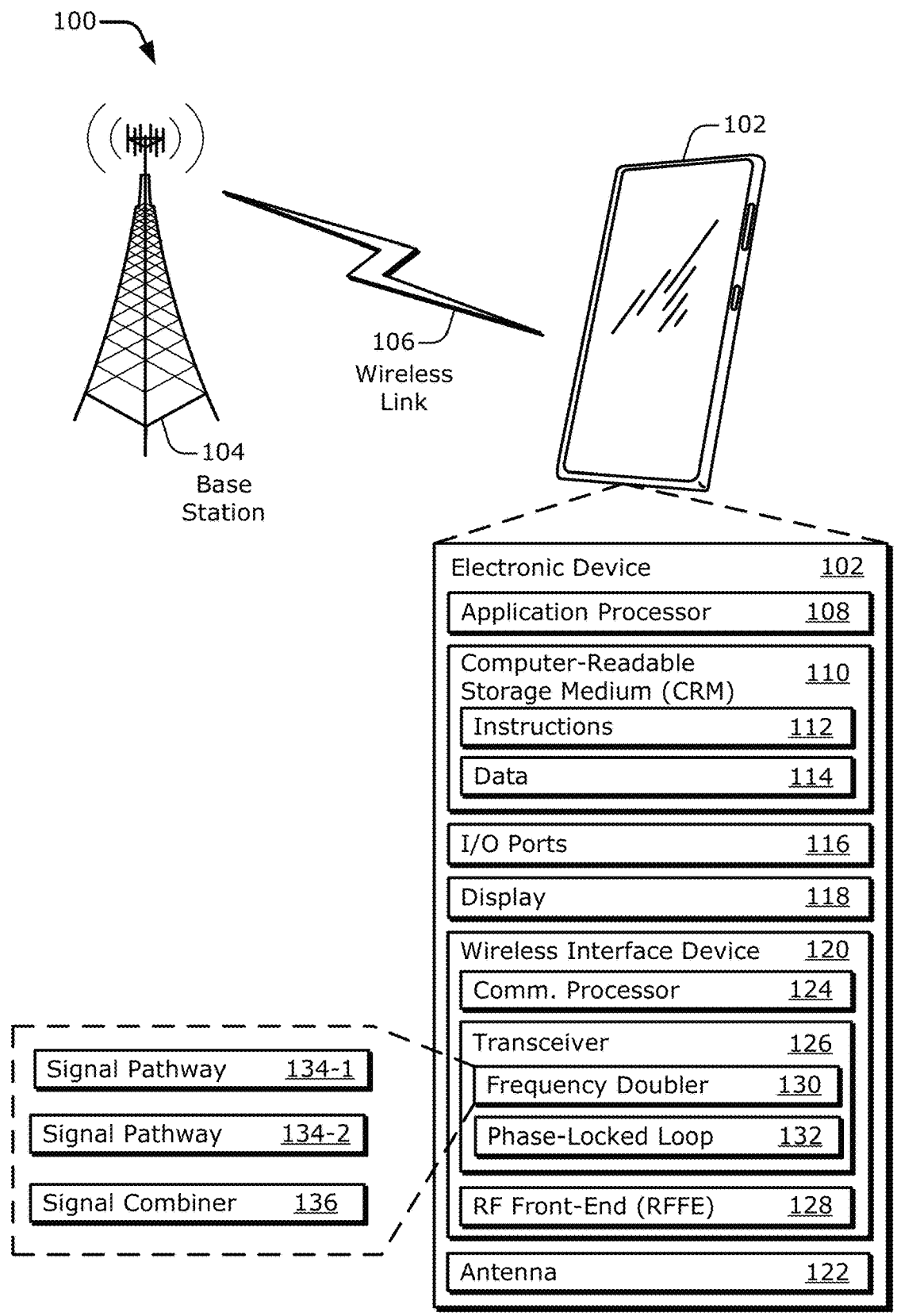
FIG. 1 illustrates an environment with an example electronic device having a wireless interface device, which includes a transceiver having a frequency doubler and a phase-locked loop (PLL).

Electronic devices use oscillating signals that rise and fall at some frequency. The frequency characteristic of a signal can be constant or can be changing responsive to some factor, such as a power control parameter or a desired frequency modulation. For example, electronic devices can use oscillating signals to control a rate at which processing operations are performed, such as with a clock signal and synchronized circuitry. Examples of circuitry that can be synchronized include a central processing unit (CPU), a graphics processing unit (GPU), a digital signal processor (DSP), a modem, and a system-on-chip (SoC). Additionally or alternatively, electronic devices can use oscillating signals to facilitate transmission and reception of signals in different communication scenarios. For instance, oscillating signals can be used with mixers that perform frequency translations for up-conversion or down-conversion operations to produce signals with higher or lower frequencies, respectively. Further, oscillating signals can be used to encode information by applying a frequency-based modulation to a signal.

These oscillating signals can be generated by a frequency synthesizer, which can include circuitry implementing some type of locked loop. In some cases, a frequency synthesizer can produce an output signal having a synthesized frequency that is based at least on a reference frequency of a reference signal and a divider value of the locked loop. The divider value at least partly controls how much the frequency synthesizer changes, such as increases or multiplies, the reference frequency to produce the synthesized frequency of the output signal. Example types of locked loops include a phase-locked loop (PLL), a delay-locked loop (DLL), and so forth. The accuracy and stability of frequency synthesizers that are based on locked loops are partially contingent on performance of the underlying circuitry, such as a feedback loop of a DLL or a feedforward path of the PLL.

In addition to a frequency characteristic, a signal can have a phase characteristic. A frequency characteristic can pertain to how many times a signal oscillates (e.g., reaches a peak value) in a given time period, such as each second. A phase characteristic can pertain to when a peak value of a given signal is reached relative to a peak value of another signal or relative to one or more other peak values of the same given signal. The phase characteristic can therefore reflect how regularly or accurately a signal is able to reproduce a highest value or a lowest value over time. To reliably use a signal for electronic communications or synchronized operations, a frequency or a phase of the signal can be established, modified, or stabilized. A PLL or a DLL can be employed as at least part of a circuit that adjusts a frequency or a phase of a signal.

A PLL is, therefore, an example component that can be included as at least part of a circuit that controls, or at least impacts, a frequency or phase characteristic of a signal. A PLL accepts an input signal with an input frequency and produces an output signal with an output frequency. The output frequency is based on the input frequency, but the output frequency can have one or more different attributes. For example, the output frequency may be designed to be more accurate or constant than the input frequency. A phase of the output signal can also be more pure or less noisy than a phase of the input signal. Further, the PLL can multiply frequencies such that the output frequency is some multiple of the input frequency. In some designs, a feedback loop of a PLL can include a phase-frequency detector (PFD), a charge pump, a loop filter (LF), a voltage-controlled oscillator (VCO), and a divider, which may be controlled by a delta-sigma modulator (DSM) (or sigma-delta modulator).

The ability of the PLL, or another locked loop, to perform these functions may be at least partially dependent on one or more attributes of the input signal. For example, PLL functionality may improve as the input frequency of the input signal increases. Phase noise performance, for instance, may be improved (e.g., phase noise of the PLL may be reduced) by increasing the input frequency. Generally, a higher input frequency may provide several advantages. First, the phase noise that is contributed by the PFD and the charge pump can be lowered by reducing a multiplication factor, N, of the frequency multiplication performed by the PLL using the divider. Second, a higher input frequency can reduce the DSM noise contribution by increasing the oversampling frequency. Third, with a higher input frequency, the bandwidth of the PLL can be increased to suppress phase noise introduced by the VCO of the PLL.

One technique to increase the input frequency involves incorporating a frequency doubler (e.g., a clock frequency doubler) between a reference signal source and an input of the PLL. The frequency doubler doubles a reference frequency of a reference signal provided by the reference signal source and forwards a signal having a doubled frequency to the PLL as an input signal thereof By doubling the reference frequency for the input frequency of the PLL input signal, a frequency doubler can improve the phase noise performance of the PLL.

In some cases, the reference signal source is realized using a crystal oscillator, such as a crystal oscillator (XO) clock. A crystal-oscillator based reference signal source, or another reference signal source, may provide a reference signal having a duty cycle error, such as an unbalanced period. With an unbalanced period, there can be an imbalance between a high portion and a low portion of the reference signal, which translates to the reference signal lacking a 50% duty cycle. For instance, the reference signal may be high for 60% of a cycle and low for 40% of a cycle instead of offering a 50-50 balance between high and low portions.

This duty cycle error in the reference signal can cause an even period/odd period mismatch in the frequency-doubled signal that is output by the frequency doubler. The even period/odd period mismatch is therefore coupled to an input of the PLL. After propagating through the PLL, the even/odd period mismatch can result in a reference spur at an output of the PLL. The reference spur decreases a quality of the output signal and degrades the performance of the PLL.

In some scenarios, duty cycle error can be ameliorated using a bang-bang phase detector (BBPD). The duty cycle error may be sensed using an analog DLL and the BBPD. In this scenario, a feedback loop of the DLL includes a PFD and a charge pump. Using both the BBPD and the PFD, however, can cause downstream errors. For example, a mismatch between a BBPD offset and a PFD offset causes a deterministic duty cycle error at the output of the PLL.

This document describes techniques that can address these various issues. For example, to at least partially reduce a PLL reference spur that can be caused by a duty cycle error in a reference signal provided from a reference signal source, implementations are described for a frequency doubler with duty cycle correction (DCC). The duty cycle correction enables the frequency doubler to output a frequency-doubled signal with reduced even period/odd period mismatch in the frequency-doubled signal. To reduce the period mismatch, the duty cycle correction scheme compensates for the duty cycle error present in the reference signal by delaying a rising edge or a falling edge of the reference signal, depending on the duty cycle.

In some implementations, the frequency doubler can perform frequency doubling with duty cycle correction across one or more of multiple (e.g., four) stages. The stages may include coarse tuning and fine tuning. To perform duty cycle correction via coarse tuning, a frequency doubler core of a frequency doubler includes two signal pathways. Each signal pathway processes a reference signal. Each signal pathway respectively includes an input buffer and an adjustable delay cell. Each respective adjustable delay cell can delay a respective type of edge of the reference signal.

For example, a first adjustable delay cell can delay falling edges, and a second adjustable delay cell can delay rising edges. If, for instance, a duty cycle of the reference signal is greater than 50% of the period, the first adjustable delay cell can delay the rising edges of the reference signal. If, on the other hand, a duty cycle of the reference signal is less than 50% of the period, the second adjustable delay cell can delay the falling edges of the signal. A length of a delay for an edge of the reference signal can be adjusted by duty cycle correction circuitry (DCC circuitry) based on, for example, a detected phase of an output signal of the frequency doubler core. The length of the delay may be adjusted by sensing the duty cycle using the detected phase and a DLL output signal.

The DCC coarse tuning can be performed prior to the fine tuning, which can include a high gain mode and a low gain mode. To implement a duty cycle correction via fine tuning in the high gain mode, the DCC circuitry can establish a direct-current (DC) bias voltage at the input of the input buffers of the signal pathways of the frequency doubler core. The direct-current bias voltage can change a pulse width output by the input buffers to further correct a duty cycle error that remains after the coarse tuning. The fine tuning can continue while the frequency doubler is operational to account for ongoing voltage and temperature variations as part of the low gain mode. Using the coarse tuning or the fine tuning techniques that are described herein (including using both) enables a wider range of duty cycle correction.

Further, described techniques can replace two phase detectors with one phase detector. One phase detector (e.g., a BBPD) can be used as part of a DLL feedback loop and as part of a duty cycle correction loop for the frequency doubler. This prevents a phase detector offset mismatch from developing due to the use of two detectors because one phase detector can be used across the two feedback loops, as is described herein. This phase detector sharing can prevent a deterministic duty cycle error from appearing at the output of the PLL due to mismatched phase detector offsets.

In these manners, an even period/odd period mismatch at an output of the frequency doubler can be reduced using a DCC circuit as described herein. By reducing this period mismatch, reference spurs at an output of a PLL that is coupled to the frequency doubler can be reduced. The reduction of the reference spurs improves the quality of the output signal of the PLL. Adjusting a DC bias voltage of the frequency doubler can further decrease a duty cycle error during, e.g., an operational or mission mode of a device. Thus, using implementations described herein enables phase noise performance of the PLL to be improved by deploying a frequency doubler without introducing an appreciable reference signal spur in the PLL output signal.

FIG. 1 illustrates an example environment 100 with an electronic device 102 having a wireless interface device 120, which includes a transceiver 126 having a frequency doubler 130 and a phase-locked loop (PLL) 132. As shown, the frequency doubler 130 includes multiple signal pathways 134-1 and 134-2 (e.g., at least two signal pathways) and at least one signal combiner 136. Other example components and example aspects of the frequency doubler 130 are described below, starting with FIG. 3.

In the environment 100, the example electronic device 102 communicates with a base station 104 through a wireless link 106. In FIG. 1, the electronic device 102 is depicted as a smartphone. The electronic device 102 may, however, be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, at least a portion of a vehicle or appliance or other equipment, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6 or WiGig®); an IEEE 802.16 standard (e.g., WiMAX®); a Bluetooth® standard; and so forth. In some implementations, the wireless link 106 may provide power wirelessly, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

As illustrated in FIG. 1, the electronic device 102 further includes at least one wireless interface device 120 and at least one antenna 122. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like.

As shown, the wireless interface device 120 includes at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem baseband processor, or as a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or another processor can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118. The presentation can be based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

The transceiver 126 can include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a superheterodyne architecture). Generally, the transceiver 126 includes filters, switches, amplifiers, mixers, and so forth for routing and conditioning signals that are transmitted or received via the antenna 122. Thus, in addition to or instead of the illustrated components, the transceiver 126 can include other components, such as an analog-to-digital converter (ADC) or a digital-to-analog converter (DAC). In operation, an ADC can convert from analog signals to digital signals, and a DAC can convert from digital signals to analog signals. An ADC or a DAC can be implemented as part of the communication processor 124, as part of the transceiver 126, or separately from both of them (e.g., as another part of an SoC or as part of the application processor 108).

Figure 2:
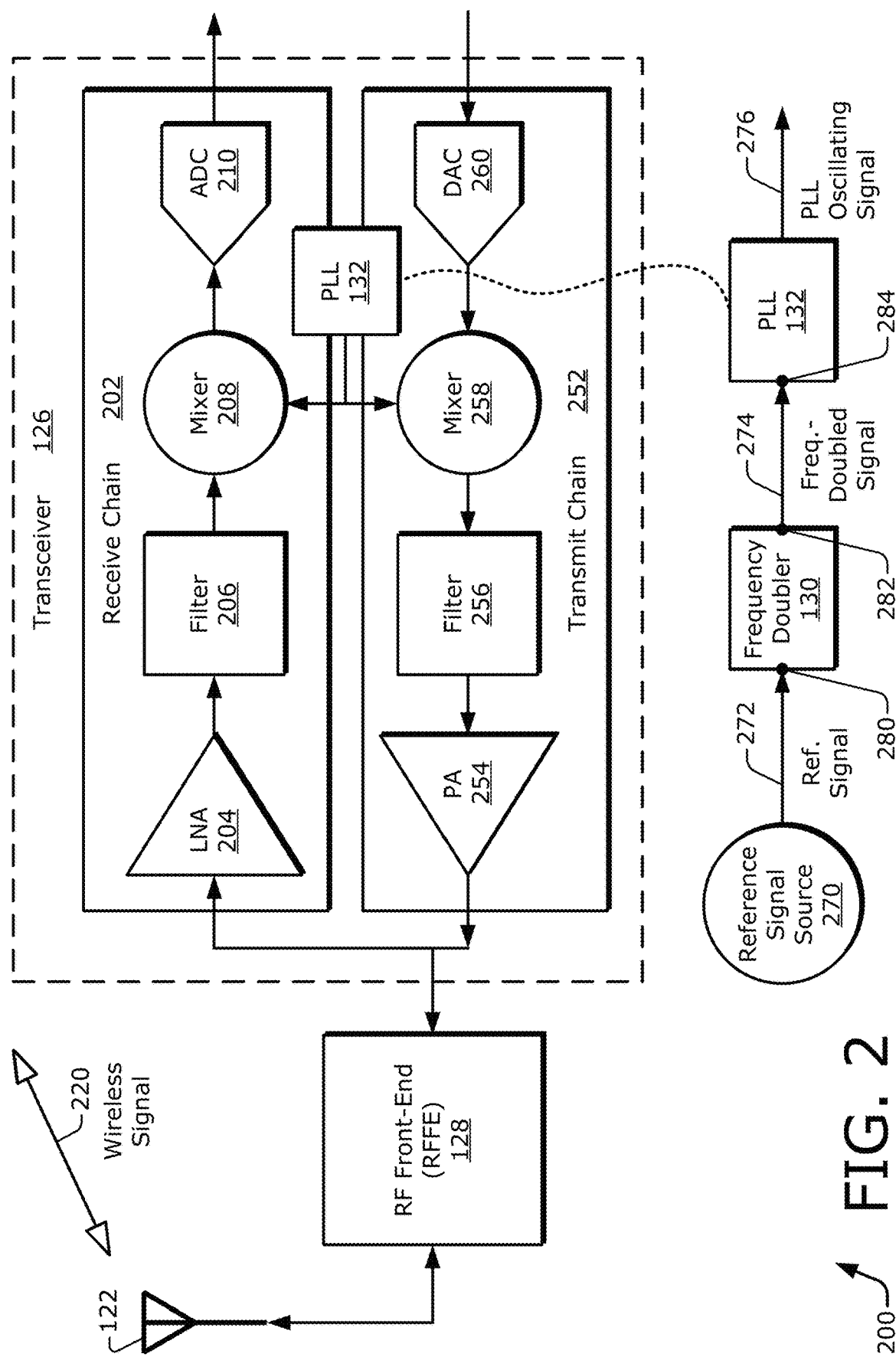
FIG. 2 illustrates an example transceiver including a phase-locked loop (PLL) that is fed by a frequency doubler, which is coupled to a reference signal source.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna 122 or signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming, just to name a few examples. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

As shown, the transceiver 126 includes at least one frequency doubler 130 and at least one phase-locked loop 132 (PLL 132). Described implementations of a frequency doubler 130 in conjunction with duty cycle correction can, however, additionally or alternatively be employed elsewhere. For example, a frequency doubler 130 (and/or a PLL 132) can be deployed in other portions of the wireless interface device 120, such as part of the communication processor 124 or the RF front-end 128. The frequency doubler 130 (and/or a PLL 132) can also or instead be deployed in other portions of the electronic device 102 generally, such as a clock generator or other frequency synthesizer of the application processor 108 or an SoC (not explicitly shown). Further, the frequency doubler 130 can be employed with another type of locked loop, such as a DLL, or without a locked loop.

In example implementations, the frequency doubler 130 includes at least one two signal pathways 134-1 and 134-2 and at least one signal combiner 136. The signal combiner 136 combines signals received from the multiple signal pathways 134-1 and 134-2. The frequency doubler 130 can be coupled to the PLL 132 to provide the combined signal as an input signal to the PLL 132. In example operations, a first signal pathway 134-1 and a second signal pathway 134-2 process a reference signal having a reference frequency in parallel. Each signal pathway 134 includes at least one respective delay cell. Each delay cell may have an adjustable (e.g., programmable) delay. Further, each signal pathway 134 may process an edge of a signal differently. For instance, the first signal pathway 134-1 may respond to a rising edge more quickly than the second signal pathway 134-2, and the second signal pathway 134-2 may respond more quickly to a falling edge than does the first signal pathway 134-1. Additional aspects of the wireless interface device 120, including with regard to the frequency doubler 130 and the PLL 132, are described next with reference to FIG. 2. Example implementations of the frequency doubler 130 are described thereafter, starting with FIG. 3.

FIG. 2 illustrates, at 200 generally, an example transceiver 126 including a phase-locked loop 132 (PLL 132) that is fed by a frequency doubler 130, which is coupled to a reference signal source 270. FIG. 2 further depicts an antenna 122 and an RF front-end 128. The reference signal source 270, the frequency doubler 130, and the PLL 132 are described below. As illustrated from left to right in FIG. 2, the antenna 122 is coupled to the RF front-end 128, and the RF front-end 128 is coupled to the transceiver 126. Although not shown in FIG. 2, the transceiver 126 can be coupled to the communication processor 124 (e.g., of FIG. 1) via an ADC 210 or a DAC 260.

The example RF front-end 128 can include at least one antenna feed line (not separately shown) coupling the antenna 122 to the transceiver 126. The example transceiver 126 includes at least one receive chain 202 and at least one transmit chain 252. Although only one RF front-end 128 and one transceiver 126 are explicitly shown at 200, an electronic device 102, or a wireless interface device 120 thereof, can include multiple instances of any or all such components (including one or more communication processors 124). Also, although only certain components are explicitly depicted in FIG. 2 and are shown coupled together in a particular manner, a wireless interface device 120 or the transceiver 126 thereof may include other non-illustrated components, more or fewer components, differently-coupled arrangements of components, and so forth.

In some implementations, the RF front-end 128 couples the antenna 122 to the transceiver 126 via the antenna feed line (not shown). Thus, in operation, the antenna feed line propagates a signal between the antenna 122 and the transceiver 126. During or as part of the propagation, the antenna feed line can condition the propagating signal. The antenna feed line can condition a propagating signal using, for example, a filter, an amplifier (e.g., a power amplifier or a low-noise amplifier), an N-plexer, a phase shifter, and so forth.

In example implementations, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a mixer 208 for frequency down-conversion, and the ADC 210. The transmit chain 252 includes a power amplifier 254 (PA 254), a filter 256, a mixer 258 for frequency up-conversion, and the DAC 260. However, the receive chain 202 or the transmit chain 252 can include other components—such as additional amplifiers or filters, multiple mixers, one or more buffers, or at least one local oscillator—that are electrically or electromagnetically coupled anywhere along the depicted receive and transmit chains. The receive chain 202 can be coupled between the RF front-end 128 and the communication processor 124, e.g., via the low-noise amplifier 204 and the ADC 210, respectively. The transmit chain 252 can be coupled between the RF front-end 128 and the communication processor 124, e.g., via the power amplifier 254 and the DAC 260, respectively. The transceiver 126 can also include at least one PLL 132, such as one PLL for each transmit/receive chain pair, one PLL per transmit chain and one PLL per receive chain, multiple PLLs, and so forth.

As shown for the receive chain 202, the antenna 122 is coupled to the low-noise amplifier 204 via the RF front-end 128, and the low-noise amplifier 204 is coupled to the filter 206. The filter 206 is coupled to the mixer 208, and the mixer 208 is coupled to the ADC 210. An output of the ADC 210 is in turn coupled to the communication processor 124 (of FIG. 1). For reception operations, a received wireless signal 220 propagates through the receive chain 202 from the low-noise amplifier 204 to the ADC 210. As shown for the transmit chain 252, the communication processor 124 is coupled to an input of the DAC 260, and the DAC 260 is coupled to the mixer 258. The mixer 258 is coupled to the filter 256, and the filter 256 is coupled to the power amplifier 254. The power amplifier 254 is coupled to the antenna 122 via the RF front-end 128. Although only one receive chain 202 and one transmit chain 252 are explicitly shown, an electronic device 102, or a transceiver 126 thereof, can include multiple instances of either or both components.

The PLL 132 is coupled to at least one of the mixer 208 or the mixer 258. The PLL 132 can generate a signal having a synthesized frequency. For signal reception, the mixer 208 can perform frequency down-conversion on a signal filtered by the filter 206 in a single conversion step, or through multiple conversion steps, using the signal having the synthesized frequency that is obtained from the PLL 132. For signal transmission, the mixer 258 upconverts an analog signal accepted from the DAC 260 to a higher frequency, such as an RF frequency, to produce an RF signal in one or multiple conversion steps. The RF signal may have a target frequency based on the synthesized frequency of the signal generated by the PLL 132.

The PLL 132 is depicted in FIG. 2 as being part of a transceiver 126 to support frequency translation or modulation operations by a mixer of at least one transmit or receive chain. However, a PLL 132 can be deployed in other portions of an electronic device, can be used in other manners or to provide other functionality, can be coupled to different components, and so forth. Examples of other functionality and applications include radar signal generation, signal demodulation, clock generation, clock multiplication, and the like. Thus, the frequency doubler 130, which provides an input signal to the PLL 132, can likewise be deployed as part of a transceiver 126 or in another part of an electronic device for wireless communications, clock generation, radar operations, and so forth. The frequency doubler 130 can also be employed with a DLL or another locked loop or can be used "separately" without feeding a locked loop.

As illustrated for certain implementations, an output of the reference signal source 270 is coupled to an input of the frequency doubler 130. An output of the frequency doubler 130 is coupled to an input of the PLL 132. In example operations, the PLL 132 accepts an input signal having an input frequency and produces an output signal having an output frequency. As shown in FIG. 2, the PLL 132 can accept the input signal from the output of the frequency doubler 130. The PLL 132 can, therefore, produce a PLL oscillating signal 276 based on the signal received from the frequency doubler 130, which is described below.

The reference signal source 270 can be realized using, for example, a crystal oscillator (XO), a VCO, another locked-loop, other circuitry that creates or distributes an oscillating signal (e.g., a clock tree), a frequency synthesizer, some combination thereof, and so forth. Thus, the reference signal source 270 produces or can provide a reference signal 272 having a reference frequency. By including the frequency doubler 130 between the output of the reference signal source 270 and the input of the PLL 132, a quality of a PLL oscillating signal 276 can be increased, as described herein in terms of at least lowering the phase noise thereof.

In example operations, the frequency doubler 130 accepts as input the reference signal 272 at a doubler input node 280. The frequency doubler 130 doubles the reference frequency of the reference signal 272 to produce a signal (e.g., a frequency-doubled signal 274) with a doubled frequency (e.g., a frequency that is twice that of the reference signal 272) at a doubler output node 282. The frequency doubler 130 provides the frequency-doubled signal 274 having the doubled frequency as the output signal of the frequency doubler 130 at the doubler output node 282. The frequency-doubled signal 274 is then coupled, forwarded, or otherwise provided to the PLL 132 as an input signal at a PLL input node 284. This higher-frequency input signal enables the PLL 132 to reach a target frequency with a lower frequency multiple, so the PLL oscillating signal 276 can therefore have a higher quality.

Accordingly, described implementations of the frequency doubler 130 can be used to feed a PLL 132 or another locked loop. However, the described frequency doubler 130 can be operated in other environments that are separate from a locked loop to otherwise provide a signal with a doubled frequency. Regardless of where or how the frequency doubler 130 is deployed, the frequency doubler 130 can be operated with duty cycle correction, which is described next with reference to FIG. 3.

Figure 3:
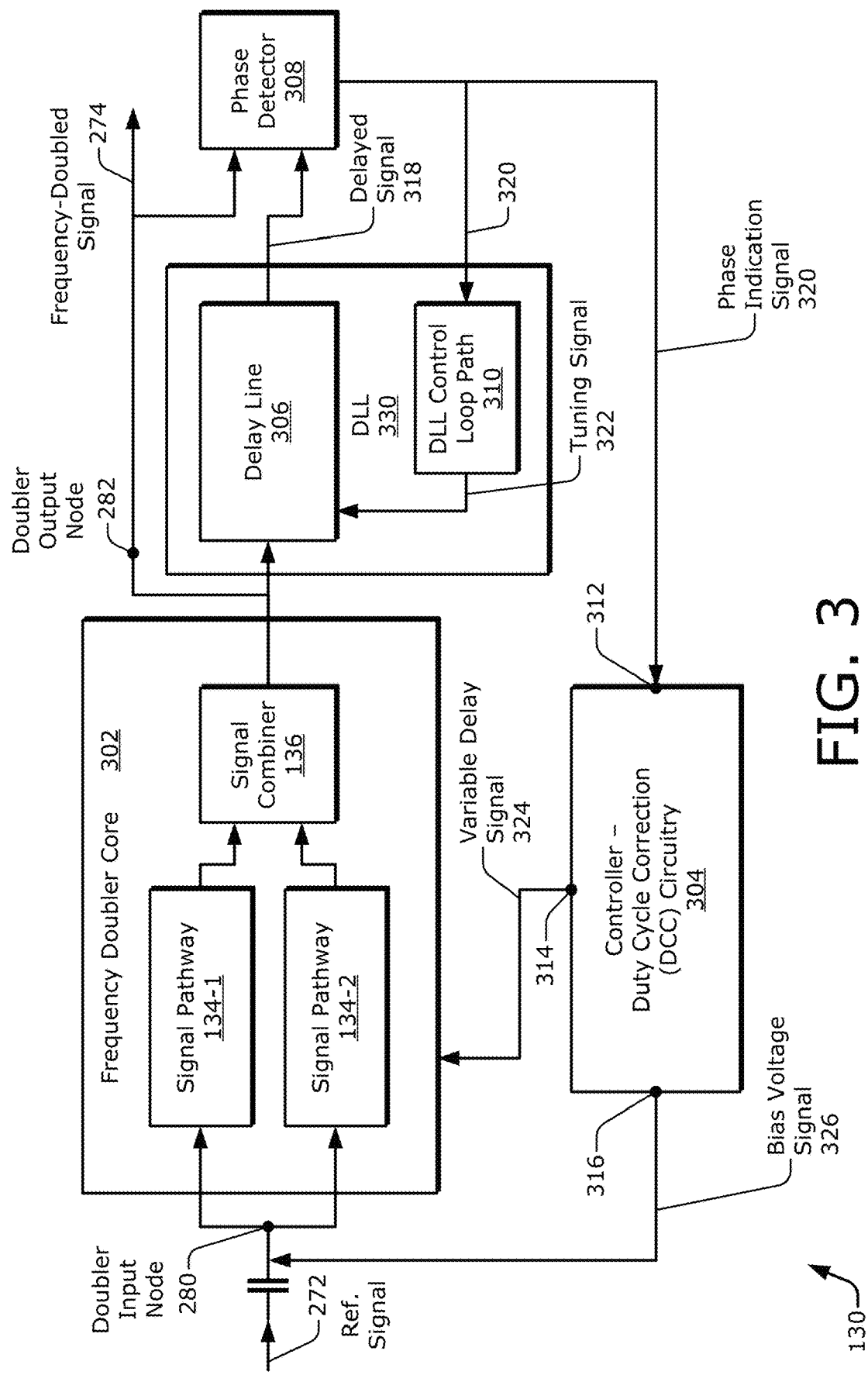
FIG. 3 illustrates an example frequency doubler including a delay-locked loop (DLL), a phase detector that is shareable, a controller, and an example frequency doubler core.
Figures 1, 3:
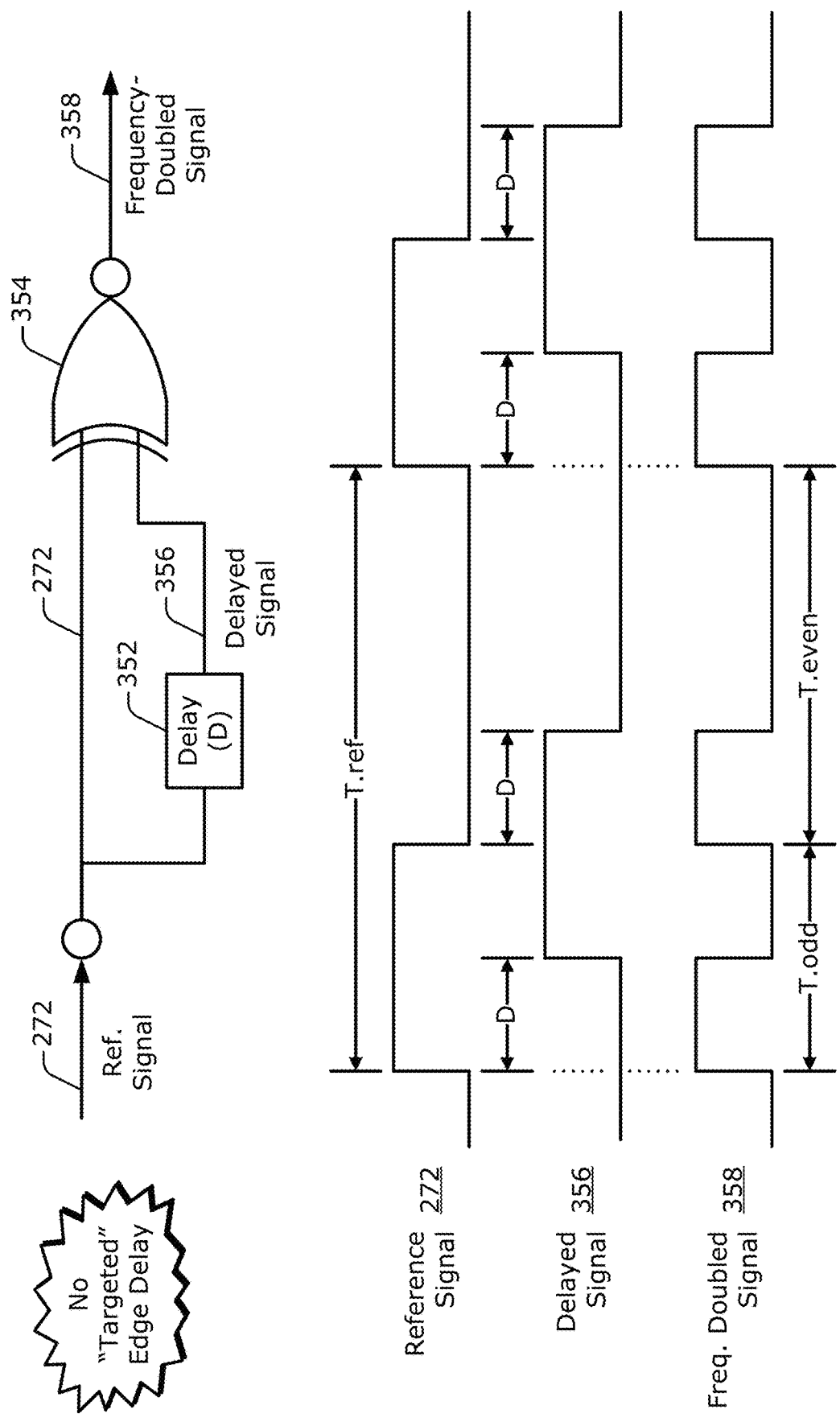
Figures 2, 3:
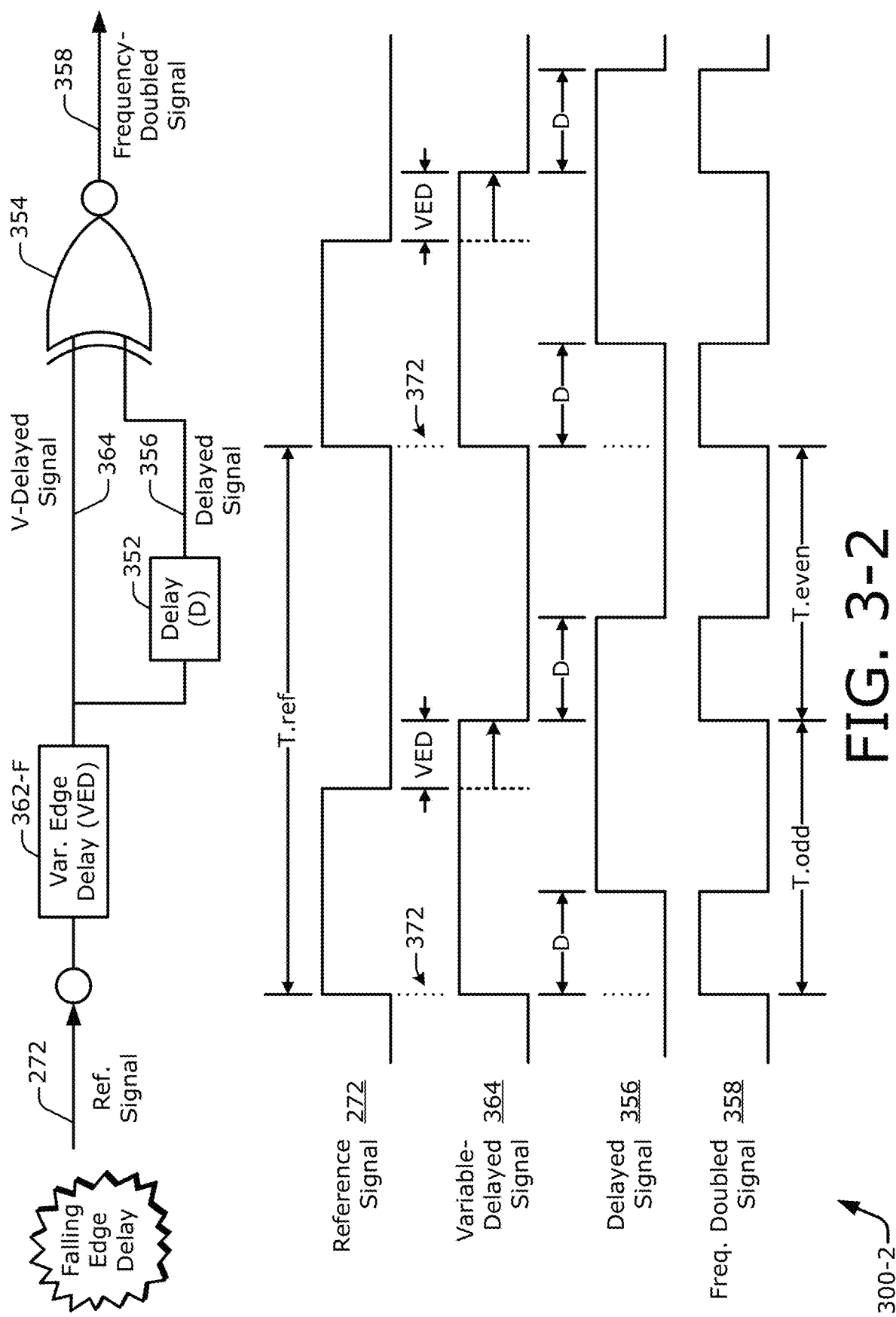
Figure 3:
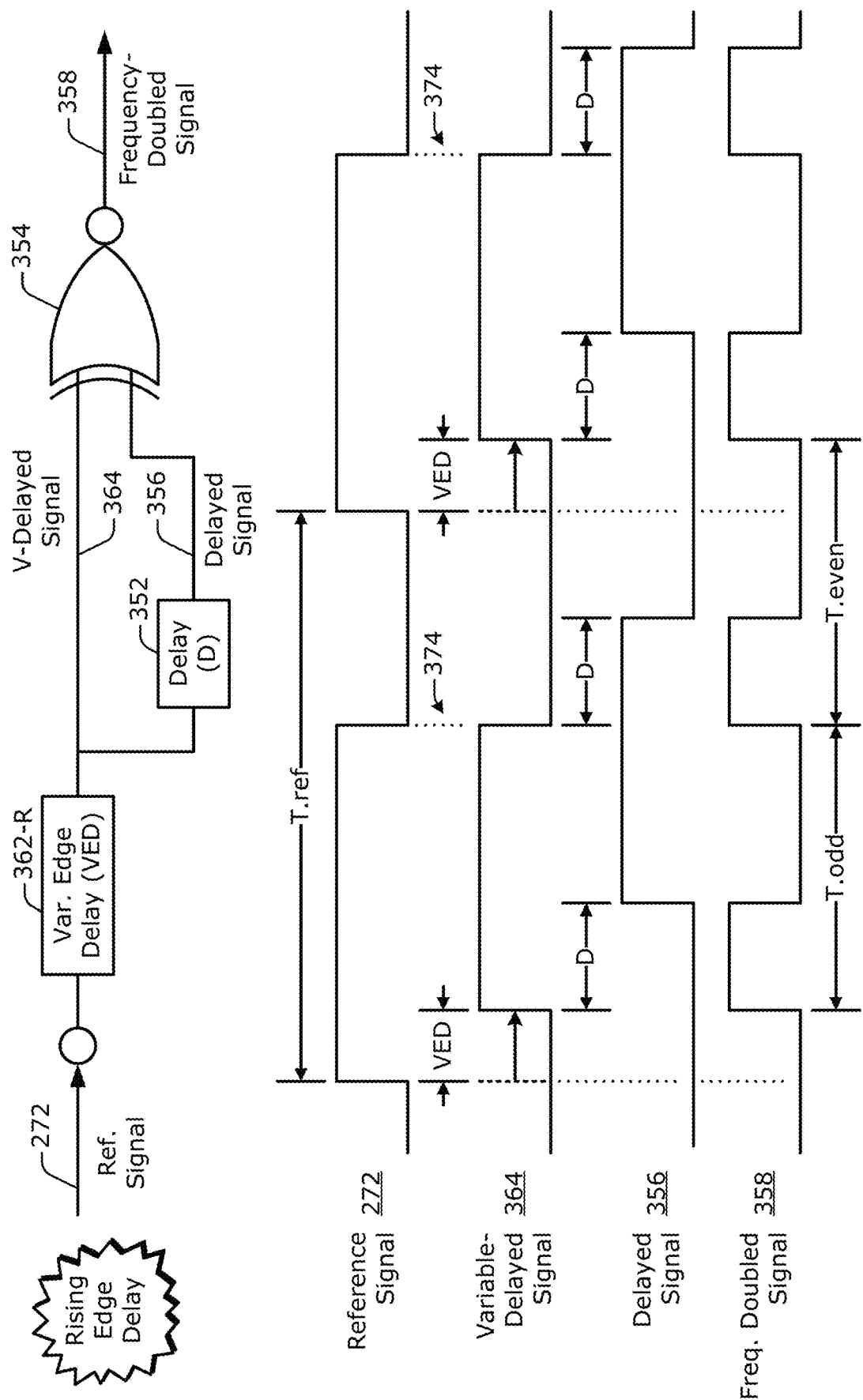

FIG. 3 illustrates an example frequency doubler 130 including at least one frequency doubler core 302. The frequency doubler core 302 includes the first signal pathway 134-1, the second signal pathway 134-2, and the signal combiner 136. As illustrated, the frequency doubler 130 also includes duty cycle correction (DCC) circuitry 304 (e.g., a controller 304 that includes DCC functionality or DCC circuitry 304), at least one delay-locked loop 330 (DLL 330), and at least one phase detector 308. The DLL 330 includes at least one delay line 306 and at least one DLL control loop path 310. Although not explicitly indicated in FIG. 3 for every component, each component or block can include at least one input node for an input thereof and at least one output node for an output thereof. For example, the DCC circuitry 304 includes a DCC input node 312, a first DCC output node 314, and a second DCC output node 316. Further, the delay line 306 may include an input node, an output node, and a tuning control node (not explicitly indicated in FIG. 3) for receiving the tuning signal 322.

In example implementations, the frequency doubler core 302 accepts the reference signal 272 as an input signal at the doubler input node 280 and produces the frequency-doubled signal 274 as an output signal at the doubler output node 282. The frequency doubler core 302 can be coupled between the reference signal source 270 and the PLL 132 (both of FIG. 2). The frequency doubler core 302 is also coupled to the DCC circuitry 304, the phase detector 308, and the DLL 330 via the delay line 306. The delay line 306 is coupled to the phase detector 308 and the DLL control loop path 310. The phase detector 308 is further coupled to the DCC circuitry 304 and the DLL 330 via the DLL control loop path 310. As shown, the delay line 306 can be coupled between the signal combiner 136 and the phase detector 308. The DLL control loop path 310 can be coupled between an output of the phase detector 308 and a control input or tuning input of the delay line 306. Also, the DCC circuitry 304 can be coupled between an output of the phase detector 308 and at least one input of the frequency doubler core 302.

The phase detector 308 is depicted in certain drawings (e.g., in FIGS. 3 and 5) and occasionally described herein as being separate from the DLL 330 and the DCC circuitry 304, but this is by way of example only. In some cases, the phase detector 308 may be part of other circuitry, such as by being part of the DLL 330. In some such cases, the DLL 330 can share the phase detector 308 with the DCC circuitry 304. Alternatively, the DCC circuitry 304 can include a phase detector 308 and share the phase detector 308 with the DLL 330. In other cases, the DLL 330 and the DCC circuitry 304 can each include or be associated with a respective phase detector 308.

In example operations, the delay line 306 accepts the frequency-doubled signal 274 and produces a delayed signal 318. The delay line 306 can be realized as a voltage-controlled delay line, as is described below. The phase detector 308 accepts the frequency-doubled signal 274 from the frequency doubler core 302 and the delayed signal 318 from the delay line 306 and produces a phase indication signal 320 based on a phase difference between the two input signals 274 and 318. The phase indication signal 320 is provided to the DCC circuitry 304 via the DCC input node 312 and the DLL control loop path 310 of the DLL 330. Thus, a single phase detector can provide the phase indication signal 320 for two control loops: the DLL control loop (of the DLL 330) and the DCC control loop (of the frequency doubler 130). By avoiding the use of two separate phase detectors, the potential for mismatches between phase detector offsets is likewise avoided. This can prevent such a mismatch from causing a deterministic duty cycle error, as is described above.

The DLL control loop path 310 produces a tuning signal 322 based on the phase indication signal 320. The DLL control loop path 310 provides the tuning signal 322 to the delay line 306 to tune a variable delay of multiple delay elements therein, which are described below with reference to FIG. 5. The DCC circuitry 304 functions as a controller to produce two signals based on the phase indication signal 320: at least one variable delay signal 324 at the first DCC output node 314 and at least one bias voltage signal 326 at the second DCC output node 316. The DCC circuitry 304 provides the bias voltage signal 326 to the doubler input node 280 to establish a bias voltage (e.g., a DC bias voltage) thereat.

Figure 4:
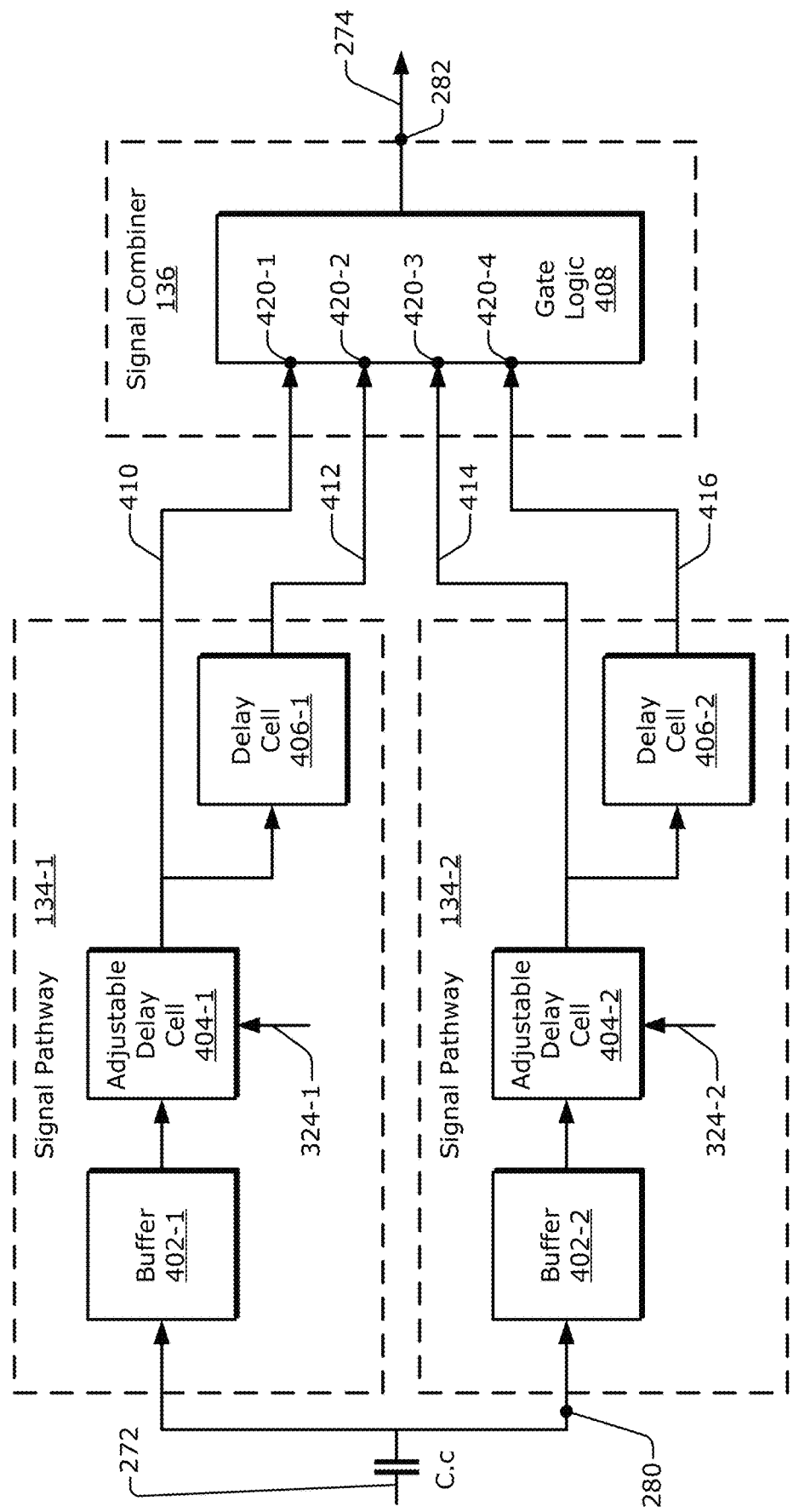
FIG. 4 illustrates an example frequency doubler core including a signal combiner and two signal pathways, which signal pathways may be coupled together in parallel.

The DCC circuitry 304 provides the at least one variable delay signal 324 to the frequency doubler core 302 to set at least one variable delay length thereof. For example, respective variable delay signals 324 (not explicitly shown in FIG. 3) may set a respective variable delay of respective variable delay cells of respective signal pathways 134. This is described further below with reference to an example frequency doubler core 302 that is depicted in FIG. 4. Next, however, this document describes example principles of frequency doubling and example associated waveforms.

FIG. 3-1 illustrates, generally at 300-1, example frequency-doubling circuitry with associated signal waveforms. The example frequency-doubling circuitry of FIG. 3-1 may omit duty-cycle correction capabilities. Here, this means that no "targeted" edge delay is instituted, which contrasts with the circuitries of FIGS. 3-2 and 3-3 which can separately target a falling edge or a rising edge, respectively, of a reference signal. The example frequency-doubling circuitry at 300-1 includes a delay unit 352 that institutes a delay D and an exclusive OR gate 354 (XOR gate 354). The circuitry accepts a reference signal 272, which is coupled to a first input of the XOR gate 354. As shown in the waveforms in the lower half of the page, the reference signal 272 includes a reference period of T.ref. To illustrate mismatched periods, this reference signal 272 does not have a 50% duty cycle.

The delay unit 352 also accepts the reference signal 272. The delay unit 352 delays the reference signal 272 by an amount D to produce a delayed signal 356, which is provided to a second input of the XOR gate 354. As illustrated in the waveforms in the lower half of FIG. 3-1, the delayed signal 356 is a version of the reference signal 272 that is delayed by the amount D for both rising and falling edges. The XOR gate 354 processes the reference signal 272 and the delayed signal 356 in accordance with an XOR logical function to produce a frequency-doubled signal 358. Thus, the frequency-doubled signal 358 is high if one, and only one, of the reference signal 272 or the delayed signal 356 is high.

A waveform of the frequency-doubled signal 358 is also shown in the lower half of FIG. 3-1. Due to the reference signal 272 failing to have a 50% duty cycle, and thus due to the reference signal 272 being unbalanced, the frequency-doubled signal 358 has mismatched even and odd periods T. In this example, the odd period T.odd is shorter than the even period T.even. As described above, the different lengths of the even and odd periods in the frequency-doubled signal can produce spurs in an output signal of an associated locked loop. To at least reduce such spurs, this document describes selectively delaying a rising edge or a falling edge of the reference signal 272 to balance the lengths of the even and odd periods of the frequency-doubled signal 358. Reducing an amount by which even and odd periods are unbalanced for duty cycles that are less than 50% and for duty cycles that are greater than 50% is described with reference to FIG. 3-2 and FIG. 3-3, respectively.

FIG. 3-2 illustrates, generally at 300-2, example frequency-doubling circuitry, including a falling-edge delay circuit (e.g., a variable edge delay unit 362-F), in conjunction with associated signal waveforms. The example frequency-doubling circuitry is directed to delaying a falling edge of a reference signal 272 that has a duty cycle of less than 50% (<50%). Relative to the circuitry of FIG. 3-1, this circuitry additionally includes a variable edge delay unit 362-F that institutes a variable edge delay of length VED with respect to falling edges. The variable edge delay unit 362-F produces a variable-delayed signal 364 based on the reference signal 272 and some control aspect, as is described herein. The variable edge delay unit 362-F provides the variable-delayed signal 364 to the first input of the XOR gate 354. Accordingly, the XOR gate 354 produces the frequency-doubled signal 358 based on the variable-delayed signal 364 and the delayed signal 356.

The waveform of the reference signal 272 has a reference period T.ref reflecting a duty cycle of less than 50%. Thus, the reference signal 272 is high for less than 50% of the reference period T.ref. In this example, the variable edge delay unit 362-F operates on the falling edge of the reference signal 272 to "extend" the duty cycle at least closer to 50% of the period T.ref. The length of this variable edge delay VED may be determined by a control loop as described herein. As shown in the lower half of FIG. 3-2, the variable-delayed signal 364 has a falling edge that is delayed by the VED amount relative to the falling edge of the reference signal 272. In contrast, the rising edge of the variable-delayed signal 364 may be substantially unaffected by the variable edge delay unit 362-F relative to the rising edge of the reference signal 272 as indicated at 372.

As shown in FIG. 3-2, an input of the delay unit 352 is coupled to an output of the variable edge delay unit 362-F. Thus, the delay unit 352 accepts as an input signal the variable-delayed signal 364 from the variable edge delay unit 362-F and produces the delayed signal 356 based on the variable-delayed signal 364. The delay unit 352 delays rising edges and falling edges of the variable-delayed signal 364 by the delay amount D. The delay unit 352 provides the resulting delayed signal 356 to the second input of the XOR gate 354. The XOR gate 354 performs a logical XOR operation on the variable-delayed signal 364 and the delayed signal 356 to produce the frequency-doubled signal 358. As shown in FIG. 3-2, the odd periods T.odd and the even periods T.even of the frequency-doubled signal 358 can have approximately equal lengths (e.g., within plus or minus 10% of each other, within +/−5% of each other, or within +/−1% of each other). This occurs because consecutive rising edges of the frequency-doubled signal 358 are spaced apart by substantially similar lengths due to the operation of the variable edge delay unit 362-F. Accordingly, the lengths of the even and odd periods of a frequency-doubled signal can be balanced for duty cycles that are less than 50% by delaying falling edges to decrease reference spurs at the output of a locked loop.

FIG. 3-3 illustrates, generally at 300-3, example frequency-doubling circuitry, including a rising-edge delay circuit (e.g., a variable edge delay unit 362-R), in conjunction with associated signal waveforms. The example frequency-doubling circuitry is directed to delaying a rising edge of a reference signal 272 that has a duty cycle of greater than 50% (>50%). Relative to the circuitry of FIG. 3-1, this circuitry additionally includes a variable edge delay unit 362-R that institutes a variable edge delay of length VED with respect to rising edges. The variable edge delay unit 362-R produces a variable-delayed signal 364 based on the reference signal 272 and some control aspect, as is described herein. The variable edge delay unit 362-R provides the variable-delayed signal 364 to the first input of the XOR gate 354 and to the input of the delay unit 352. The XOR gate 354 produces the frequency-doubled signal 358 based on the variable-delayed signal 364 and the delayed signal 356.

The waveform of the reference signal 272 has a reference period T ref reflecting a duty cycle of greater than 50%. Thus, the reference signal 272 is high for more than 50% of the reference period T.ref. In this example, the variable edge delay unit 362-R operates on the rising edge of the reference signal 272 to "decrease" the duty cycle to be at least closer to 50% of the period T.ref. The length of this variable edge delay VED may be determined by a control loop as described herein. As shown in the lower half of FIG. 3-3, the variable-delayed signal 364 has a rising edge that is delayed by the VED amount relative to the rising edge of the reference signal 272. In contrast, the falling edge of the variable-delayed signal 364 may be substantially unaffected by the variable edge delay unit 362-R relative to the falling edge of the reference signal 272 as indicated at 374.

The delayed signal 356 can follow the variable-delayed signal 364 that is delayed in time by the delay D at both rising and falling edges as shown in FIG. 3-3. The XOR gate 354 performs a logical XOR operation on the variable-delayed signal 364 and the delayed signal 356 to produce the frequency-doubled signal 358. As shown in FIG. 3-3, the odd periods T.odd and the even periods T.even of the frequency-doubled signal 358 can have approximately equal lengths. This occurs because consecutive rising edges of the frequency-doubled signal 358 are spaced apart by substantially similar lengths. Thus, the lengths of the even and odd periods of a frequency-doubled signal can be balanced for duty cycles that are greater than 50% by delaying rising edges to decrease reference spurs at the output of a locked loop.

In the example frequency-doubling circuitries of FIGS. 3-2 and 3-3, the delay unit 352 receives the variable-delayed signal 364. Alternatively, the delay unit 352 may receive the reference signal 272 to produce the delayed signal 356. In such cases, the duty cycles of the variable-delayed signal 364 and the delayed signal 356 may have unequal lengths. Consequently, the duty cycles of the odd and even periods T.odd and T.even of the frequency-doubled signal 358 may also be unequal to each other. Nonetheless, consecutive rising edges of the frequency-doubled signal 358 may occur at regular intervals to produce equal lengths for the even periods T.even and the odd periods T.odd.

The example frequency doubler core 302 that is depicted in FIG. 4 implements an architecture in which the delay unit is fed a signal from an output of the variable or adjustable edge delay unit as shown in FIGS. 3-2 and 3-3. This may provide substantially equal duty cycles for the odd and even periods T.odd and T.even of the frequency-doubled signal. The example frequency doubler core 302 described next with reference to FIG. 4 can selectively delay the rising edges or the falling edges of a reference signal 272 depending on the duty cycle thereof to account for duty cycles that are less than 50% and to account for duty cycles that are more than 50%. In other words, the example frequency doubler core 302 of FIG. 4 can accommodate duty cycle situations like those of FIG. 3-2 and like those of FIG. 3-3.

FIG. 4 illustrates an example frequency doubler core 302 including a signal combiner 136 and two signal pathways 134-1 and 134-2. The two signal pathways 134-1 and 134-2 may be coupled together substantially in parallel between the doubler input node 280 and the signal combiner 136. As illustrated, by way of example only, each respective signal pathway 134 respectively includes at least one buffer 402, at least one adjustable delay cell 404, and at least one delay cell 406. Thus, the first signal pathway 134-1 can include a first buffer 402-1, a first adjustable delay cell 404-1, and a first delay cell 406-1. The second signal pathway 134-2 can include a second buffer 402-2, a second adjustable delay cell 404-2, and a second delay cell 406-2.

The signal combiner 136 can include gate logic 408. The signal combiner 136, including the gate logic 408 thereof, can include multiple input nodes for respective ones of multiple input signals. These can include a first input node 420-1 for a first input, a second input node 420-2 for a second input, a third input node 420-3 for a third input, and a fourth input node 420-4 for a fourth input. The first buffer 402-1 and the first adjustable delay cell 404-1 are coupled together in series between the doubler input node 280 and the first input of the gate logic 408. The first buffer 402-1, the first adjustable delay cell 404-1, and the first delay cell 406-1 are coupled together in series between the doubler input node 280 and the second input of the gate logic 408. The second buffer 402-2 and the second adjustable delay cell 404-2 are coupled together in series between the doubler input node 280 and the third input of the gate logic 408. The second buffer 402-2, the second adjustable delay cell 404-2, and the second delay cell 406-2 are coupled together in series between the doubler input node 280 and the fourth input of the gate logic 408.

In example implementations, the first adjustable delay cell 404-1 accepts a first variable delay signal 324-1 from the DCC circuitry 304 (e.g., of FIGS. 3 and 5), and the second adjustable delay cell 404-2 accepts a second variable delay signal 324-2. Each respective variable delay signal 324 controls a length of a respective variable delay of the respective adjustable delay cell 404. Thus, delay periods or delay lengths imposed by the multiple signal pathways 134-1 and 134-2 can be separately or independently controlled.

Further, each respective signal pathway 134 can have a respective sensitivity to a respective edge of the reference signal 272. In some cases, each respective buffer 402 is sensitive to a particular edge type, such as by being rising-edge sensitive or falling-edge sensitive. For example, the first signal pathway 134-1 can be relatively more sensitive to rising edges of the reference signal 272 (e.g., from an external perspective, as is described below), and the second signal pathway 134-2 can be relatively less sensitive to the rising edges of the reference signal 272. Conversely, the second signal pathway 134-2 can be relatively more sensitive to falling edges of the reference signal 272, and the first signal pathway 134-1 can be relatively less sensitive to the falling edges of the reference signal 272.

In some implementations, each respective buffer 402 has a respective edge sensitivity. For instance, if the first buffer 402-1 is more sensitive to a rising edge than is the second buffer 402-2, then the first buffer 402-1 can respond sooner, more quickly, or with less of a voltage increase as compared to the second buffer 402-2 based on a rising edge of the reference signal 272. Similarly, if the second buffer 402-2 is more sensitive to a falling edge than is the first buffer 402-1, then the second buffer 402-2 can respond sooner, more quickly, or with less of a voltage decrease as compared to the first buffer 402-1 based on a falling edge of the reference signal 272. Examples of this edge sensitivity for the first and second buffers 402-1 and 402-2 are described below with reference to FIG. 7.

With the first buffer 402-1 being more sensitive to a rising edge, the first adjustable delay cell 404-1 can change how soon, how late, or otherwise when the rising edge is forwarded to the first delay cell 406-1 and the gate logic 408. In contrast, with the second buffer 402-2 being more sensitive to a falling edge, the second adjustable delay cell 404-2 can change how soon, how late, or otherwise when the falling edge is forwarded to the second delay cell 406-2 and the gate logic 408. The respective delays by the first and second adjustable delay cells 404-1 and 404-2 can be respectively controlled by the first and second variable delay signals 324-1 and 324-2. Thus, the frequency doubler core 302 can selectively correct a duty cycle in terms of a rising edge portion or a falling edge portion, or both. This increases the effective range of the duty cycle correction scheme and enables the error of duty cycles that are less than or more than 50% to both be corrected.

The gate logic 408 receives a rising-edge-adjusted signal 410 at the first input node 420-1 from the first adjustable delay cell 404-1 and a first delayed signal 412 at the second input node 420-2 from the first delay cell 406-1. The gate logic 408 also receives a falling-edge-adjusted signal 414 at the third input node 420-3 from the second adjustable delay cell 404-2 and a second delayed signal 416 at the fourth input node 420-4 from the second delay cell 406-2. The gate logic 408 combines these four signals to produce the frequency-doubled signal 274 at the doubler output node 282. Example approaches to combining these signals with multiple logic gates are described below.

Figure 5:
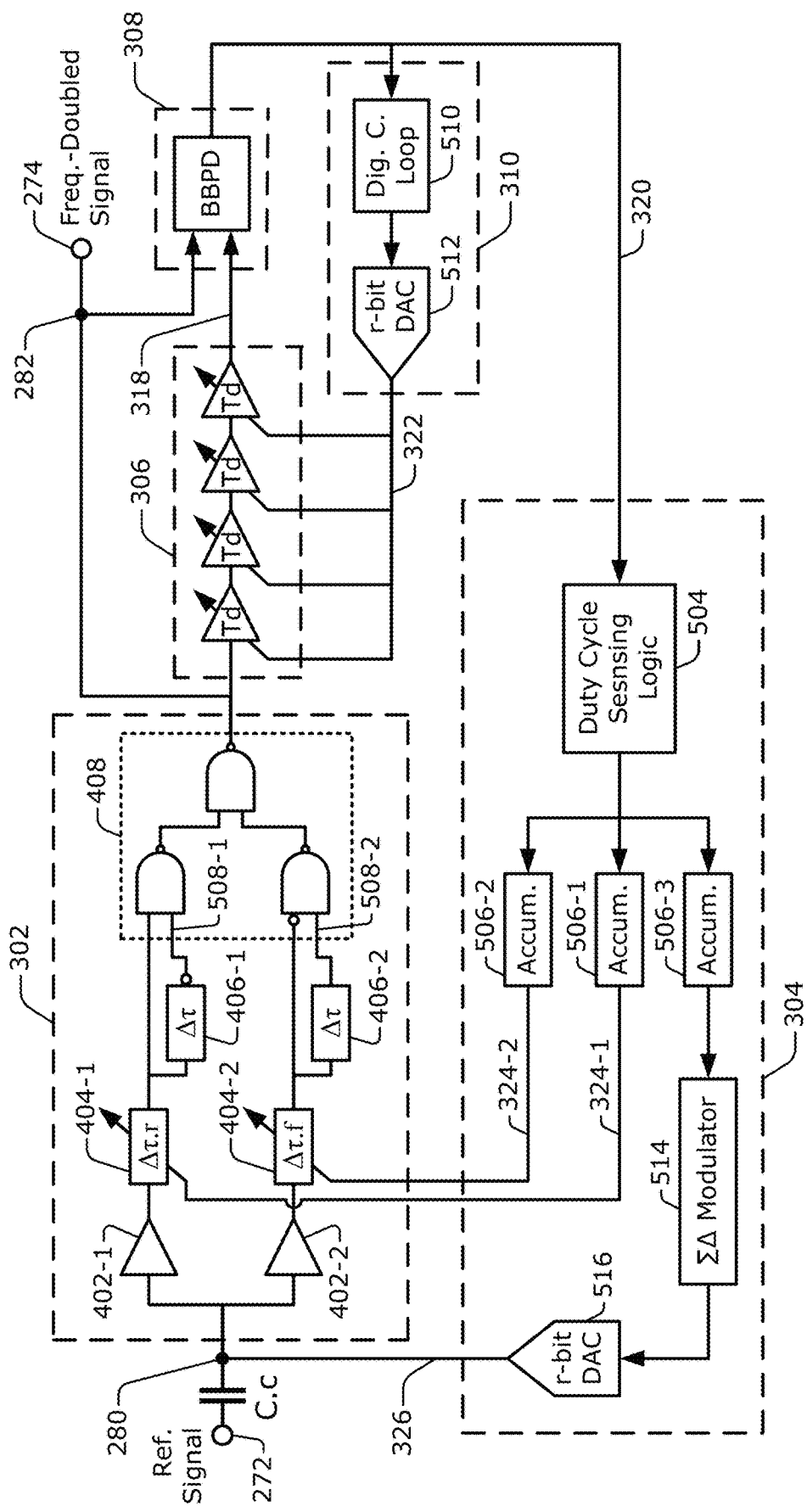
FIG. 5 illustrates another example frequency doubler including an example frequency doubler core, a phase detector that can be shared, and an example controller having duty cycle correction (DCC) circuitry.
Figures 1, 5:
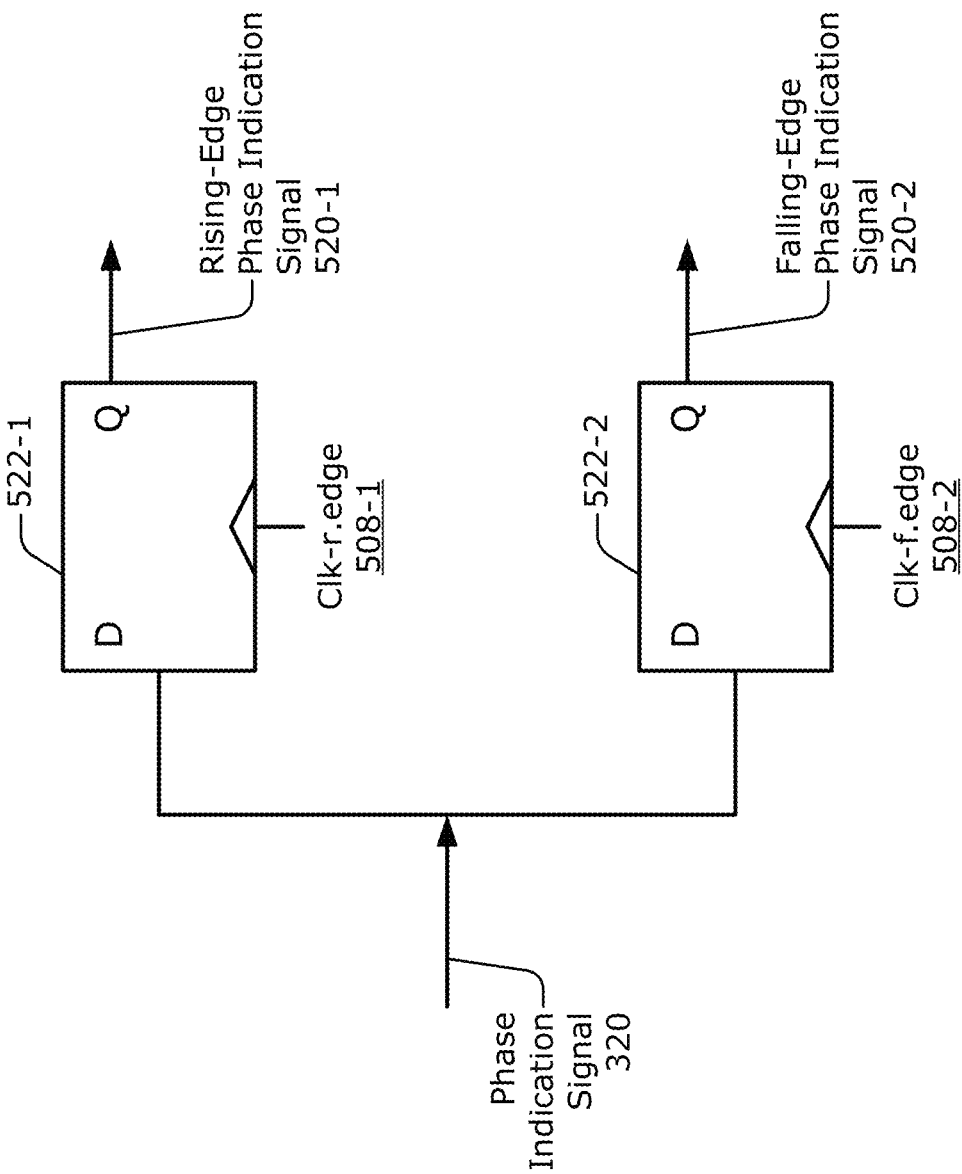

FIG. 5 illustrates another example frequency doubler 130 including a frequency doubler core 302 and a phase detector 308 that can be shared. For this example, a coupling capacitor C.c is coupled between the reference signal source 270 (e.g., of FIG. 2) and the doubler input node 280. The gate logic 408 of the signal combiner 136 (e.g., of FIGS. 1, 3, and 4) is depicted as being realized using three NAND gates. However, a different quantity, arrangement, or type(s) of gates may alternatively be employed for the gate logic 408. Operation of this example implementation of the gate logic 408 is described below with reference to FIG. 7. As shown in FIG. 5, the first adjustable delay cell 404-1 is associated with a rise time delay $\Delta\tau.r$ to produce a rising edge signal, and the second adjustable delay cell 404-2 is associated with a fall time delay $\Delta\tau.f$ to produce a falling edge signal.

In example implementations, the delay line 306 includes multiple delay elements, each of which has a delay Td. Although four delay elements are explicitly shown in FIG. 5, a delay line 306 may have more or fewer delay elements. Here, the phase detector 308 is realized using a bang-bang phase detector (BBPD). Another phase detector type, however, may be used instead. The DLL control loop path 310 includes a digital control loop 510 ("Dig. C. Loop 510") and a DAC 512 (e.g., "r-bit DAC," with r representing a positive integer), which together produce the tuning signal 322 based on the phase indication signal 320.

The digital control loop 510 of the DLL control loop path 310 can include, for instance, an accumulator (e.g., an up/down counter) and a DSM (neither of which are shown) to feed the DAC 512 of the DLL control loop path 310. The digital circuitry of the DLL control loop path 310 can interface with a BBPD implementation of the phase detector 308 to increase or decrease a digital value in the accumulator responsive to the phase indication signal 320. The accumulator feeds the digital value to the DSM, which controls the DAC 512. Alternatively, the accumulator can "directly" feed the DAC without using a DSM. The DAC 512, which may be implemented with a switched capacitor array, provides an analog signal as the tuning signal 322 based on an output of the DSM. The tuning signal 322 can use voltage, for instance, to control the delay times Td of the multiple delay elements of a voltage-controlled implementation of the delay line 306.

The DCC circuitry 304, or controller 304, can include duty cycle sensing logic 504, multiple (e.g., three) accumulators 506-1 to 506-3, a delta-sigma modulator 514 (DSM 514) (or "$\Sigma\Delta$ Modulator"), and a DAC 516 (e.g., "r-bit DAC"). Example operations of these components, in conjunction with providing duty cycle correction to the frequency doubler core 302, are described with reference to FIGS. 5-1 to 9. Examples of the duty cycle sensing logic 504, in particular, are described with reference to FIG. 5-1. The accumulators 506-1, 506-2, and 506-3 can be implemented as integrators, up/down counters, and so forth. More or fewer than three accumulators may alternatively be implemented. As shown, an output of the first accumulator 506-1 at least partially controls the adjustable delay period that the first adjustable delay cell 404-1 applies to the rising edges of the reference signal 272 using the first variable delay signal 324-1. Similarly, an output of the second accumulator 506-2 at least partially controls the adjustable delay period that the second adjustable delay cell 404-2 applies to the falling edges of the reference signal 272 using the second variable delay signal 324-2.

Further, an output of the third accumulator 506-3 at least partially controls the voltage that the DAC 516 applies to the doubler input node 280 using the bias voltage signal 326. The DSM 514, if included, can provide higher resolution to the DAC 516 of the DCC circuitry 304. The output of the DAC 516 provides the bias voltage signal 326 for the doubler input node 280 to at least partially establish a DC bias voltage at the input(s) of the first and second buffers 402-1 and 402-2. Certain components may be depicted or described in terms of a particular number of bits or bit-widths throughout this document and the accompanying drawings. For example, the two DACs in FIG. 5 may have r bits (e.g., r=8). However, these quantities and bit-widths are provided by way of example only. Such components may have more or fewer bits. Moreover, a given variable (e.g., the variable "r") may take different values for different components, in different environments or circuits, and so forth.

In some implementations, the DLL control loop path 310 (and thus the delay line 306) of the DLL 330 (e.g., of FIG. 3) can be controlled using the BBPD of the phase detector 308. The DCC circuitry 304 for the frequency-doubling control loop can also be controlled using the same BBPD of the phase detector 308. Thus, there is no deterministic error due to mismatched phase detector offsets arising from using two phase detectors—one for each loop—because a single phase detector may be employed for both loops. The DLL control loop path 310, the duty cycle sensing logic 504, the accumulators 506-1 to 506-3, and the DSM 514 may be implemented with a combination of digital circuitry and other circuits, or otherwise at least partially digitally. In some such cases, the digital-based DLL 330 can lower power consumption and reduce design efforts.

The first and second buffers 402-1 and 402-2 can each produce a buffered reference signal for a respective signal pathway 134-1 and 134-2 (e.g., of FIGS. 3 and 4). Further, the two AC-coupled buffers 402-1 and 402-2 are associated with respective ones of the two adjustable delay cells 404-1 and 404-2 that enable independently programmable delays for widening the DCC range. Assuming good matching between the rise and fall times of the input reference signal 272, the low frequency noise at the doubler input node 280 from the DLL 330, the DSM 514, and the DAC 516 (e.g., an R-2R DAC) of the DCC circuitry 304 is substantially cancelled at the doubler output node 282. This occurs because the following PLL (e.g., of FIG. 2) "sees" the average phase of the frequency-doubled signal 274 at the doubler output node 282, which average phase is not impacted by the bias noise from the bias voltage signal 326.

The frequency doubler 130 can be initiated and/or operated in various stages. For example, the $\Delta\tau\_r$ and $\Delta\tau\_f$ delays of the first and second adjustable delay cells 404-1 and 404-2 may be adjusted during power-on to perform a coarse correction of duty cycle error during an initialization period. The bias voltage-setting function of the DCC, however, can continue running in the background to track voltage and temperature variations during a runtime period (e.g., a mission mode period). As described further below, particularly with reference to FIG. 8, the background DCC can be performed by adjusting the bias voltage at the input buffers 402-1 and 402-2. Prior to that, different stages for initiating and/or operating the frequency doubler 130 are described with reference to FIG. 6. Next, however, techniques for sensing a duty cycle are described with reference to FIG. 5-1.

FIG. 5-1 illustrates example duty cycle sensing logic 504 for example DCC circuitry 304 (e.g., for the controller 304 of FIGS. 3 and 5). The duty cycle sensing logic 504 accepts the phase indication signal 320 from the phase detector 308. The phase detector 308 produces the phase indication signal 320 based on a phase difference between the frequency-doubled signal 274 and the delayed signal 318. Thus, the duty cycle sensing logic 504 can generate one or more signals based on the phase difference between the frequency-doubled signal 274 and the delayed signal 318.

In example implementations, the duty cycle sensing logic 504 can include two flip-flops 522-1 and 522-2. As shown, each flip-flop 522 can be realized using a "D" flip-flop having an input coupled to the phase indication signal 320. A first flip-flop 522-1 produces a rising-edge phase indication signal 520-1 based on the phase indication signal 320 and responsive to a rising-edge clock signal 508-1 ("Clk-r.edge" 508-1). The rising-edge clock signal 508-1 can be produced by the first delay cell 406-1 as shown in FIG. 5. A second flip-flop 522-2 produces a falling-edge phase indication signal 520-2 based on the phase indication signal 320 and responsive to a falling-edge clock signal 508-2 ("Clk-f.edge" 508-2). The falling-edge clock signal 508-2 can be produced by the second delay cell 406-2 as shown in FIG. 5. The duty cycle sensing logic 504 senses the duty cycle using the phase indication signal 320 in conjunction with the rising or falling waveforms in the multiple signal pathways 134-1 and 134-2 of the frequency doubler core 302 (e.g., of FIGS. 3 and 4).

In example operations, the duty cycle sensing logic 504 processes the rising-edge phase indication signal 520-1 and the falling-edge phase indication signal 520-2 to control the accumulators 506-1, 506-2, and 506-3. Based on the two phase indication signals 520-1 and 520-1, the duty cycle sensing logic 504 can command an accumulator 506-1, 506-2, or 506-3 to increment or decrement or can effect no change to the accumulator value. An example approach to processing the duty cycle information is set forth in Table 1.

TABLE 1

Example Operational Parameters for the Duty Cycle Sensing Logic 504

| Rising-Edge Phase Indication Signal 520-1 | Falling-Edge Phase Indication Signal 520-2 | "DAC" Accumulator 506-3 | "Rising Edge" Accumulator 506-1 | "Falling Edge" Accumulator 506-2 |
|---|---|---|---|---|
| 0 | 0 | No change | No change | No change |
| 0 | 1 | Decrement | Decrement | Increment |
| 1 | 0 | Increment | Increment | Decrement |
| 1 | 1 | No change | No change | No change |

If, for instance, the falling-edge phase indication signal 520-2 is high while the rising-edge phase indication signal 520-1 is not (e.g., as in row two), the duty cycle sensing logic 504 causes the "falling edge" accumulator 506-2 to increment. Duty cycle sensing logic 504 may, however, be implemented using different circuitry, based on different signals from the frequency doubler core 302, and so forth.

Figure 6:
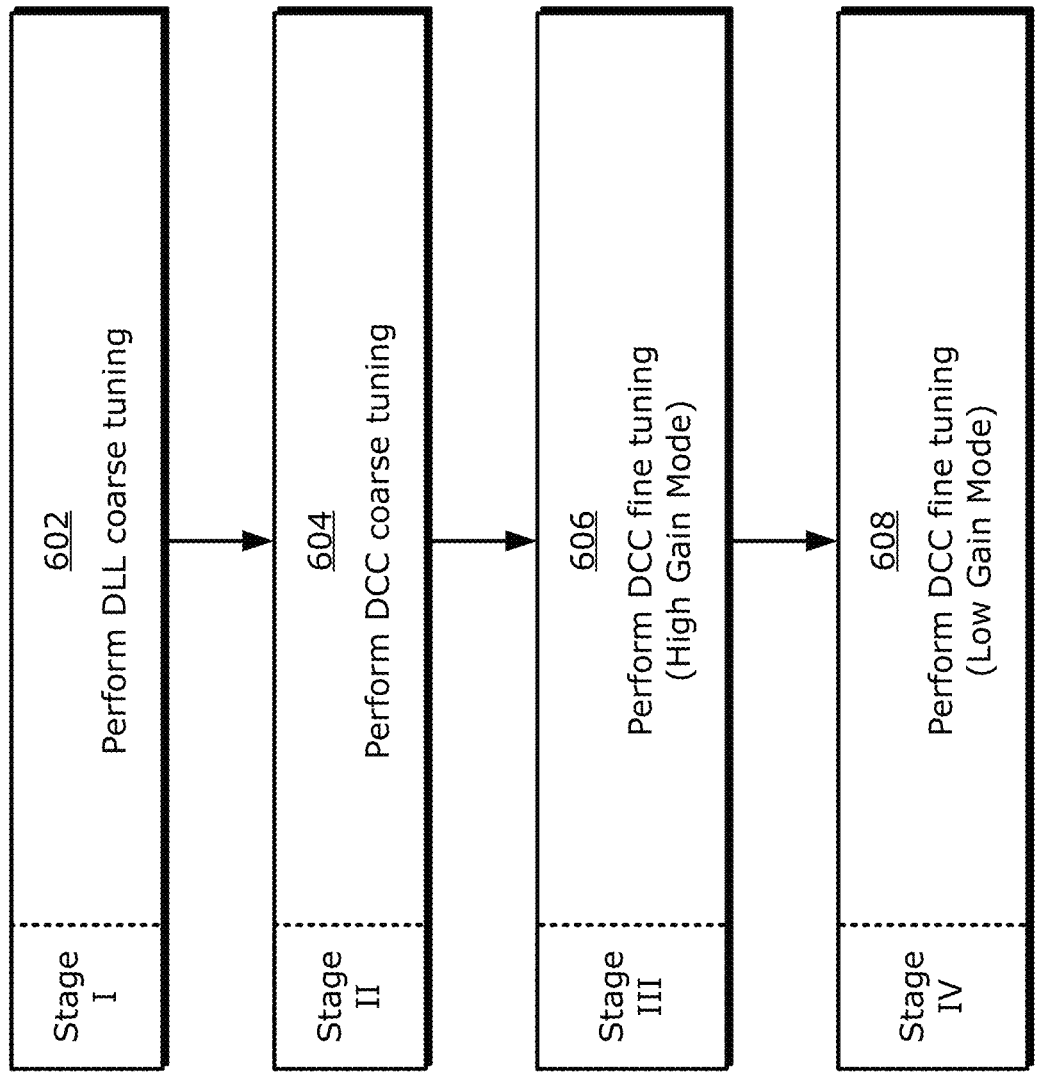
FIG. 6 is a flow diagram illustrating an example process that includes four stages for controlling a frequency doubler.

FIG. 6 is a flow diagram illustrating an example process 600 for controlling a frequency doubler 130 with the process including four stages. Although four example stages are described in a particular order sequentially, control of a frequency doubler 130 can include more or fewer stages, a different quantity of stages, at least some overlapping operation, a different order of stages, and so forth. In example implementations, in Stage I at 602, a DLL coarse tuning is performed. This can involve tuning the delay elements of the delay line 306. Logic, which operates using a successive approximation register (SAR) for example, can be adopted to reduce the locking time of the DLL 330. A SAR module can be controlled by a wide-range phase detector (WRPD), instead of a BBPD, to avoid undesired harmonic locking in the DLL—e.g., to "focus" the DLL on the fundamental frequency. After a binary search is completed, a determined code of the SAR circuit is loaded into a DLL counter. The DLL counter may be run in the background to track process-voltage-temperature (PVT) variations. During Stage I, the DLL code can be updated to the exclusion of DCC operations.

Stages II through IV are performed next. A DCC DAC code (e.g., for the accumulator 506-3 in FIG. 5) can be set to an initial value, and digital-to-time conversion (DTC) codes (e.g., of the accumulators 506-1 and 506-2 that provide the first and second variable delay signals 324-1 and 324-2) can be set to zero (0). In Stage II at 604, a DCC coarse tuning is performed. This can involve establishing the values of the first and second variable delay signals 324-1 and 324-2. For instance, two UP/DN counters as represented by the accumulators 506-1 and 506-2 may be controlled by the BBPD to determine a suitable code for the first and second adjustable delay cells 404-1 and 404-2. As described below, these two adjustable delay cells 404-1 and 404-2, at least in conjunction with the two associated accumulators, can operate as two digital-to-time converters (DTCs). The DCC DAC code can remain at its initial value during Stage II. In some cases, after the DCC coarse tuning of Stage II is complete, one of the DTC codes has a none-zero value, and the other DTC code has a zero value.

In Stage III at 606, DCC fine tuning in a high gain mode is performed. This can involve setting the DCC DAC code for the DAC 516 using a relatively higher bandwidth. After the DCC coarse tuning of Stage II, the values of the two DTC counters can remain unchanged. The remaining DC error, if any, can be substantially corrected by changing the DCC DAC code of the DAC 516 of the DCC circuitry 304. To reduce the settling time of the DCC loop, a larger loop bandwidth can be employed initially and then downshifted to a smaller loop bandwidth—e.g., after few microseconds—for low-noise performance. Thus, in Stage IV at 608, DCC fine tuning in a low gain mode is performed. This can involve setting the DCC DAC code of the DAC 516 with a relatively lower bandwidth. Thus, the DCC loop bandwidth downshifts to a lower value or level to reduce the noise. In some cases, the DCC loop of the DCC circuitry 304 can continue to run in the background to track PVT variations. Although certain control stages are described with reference to the process 600, a frequency doubler 130 can be initialized or operated in alternative manners. For example, more or fewer control stages, different control stages, or overlapping control stages may be implemented.

Figure 7:
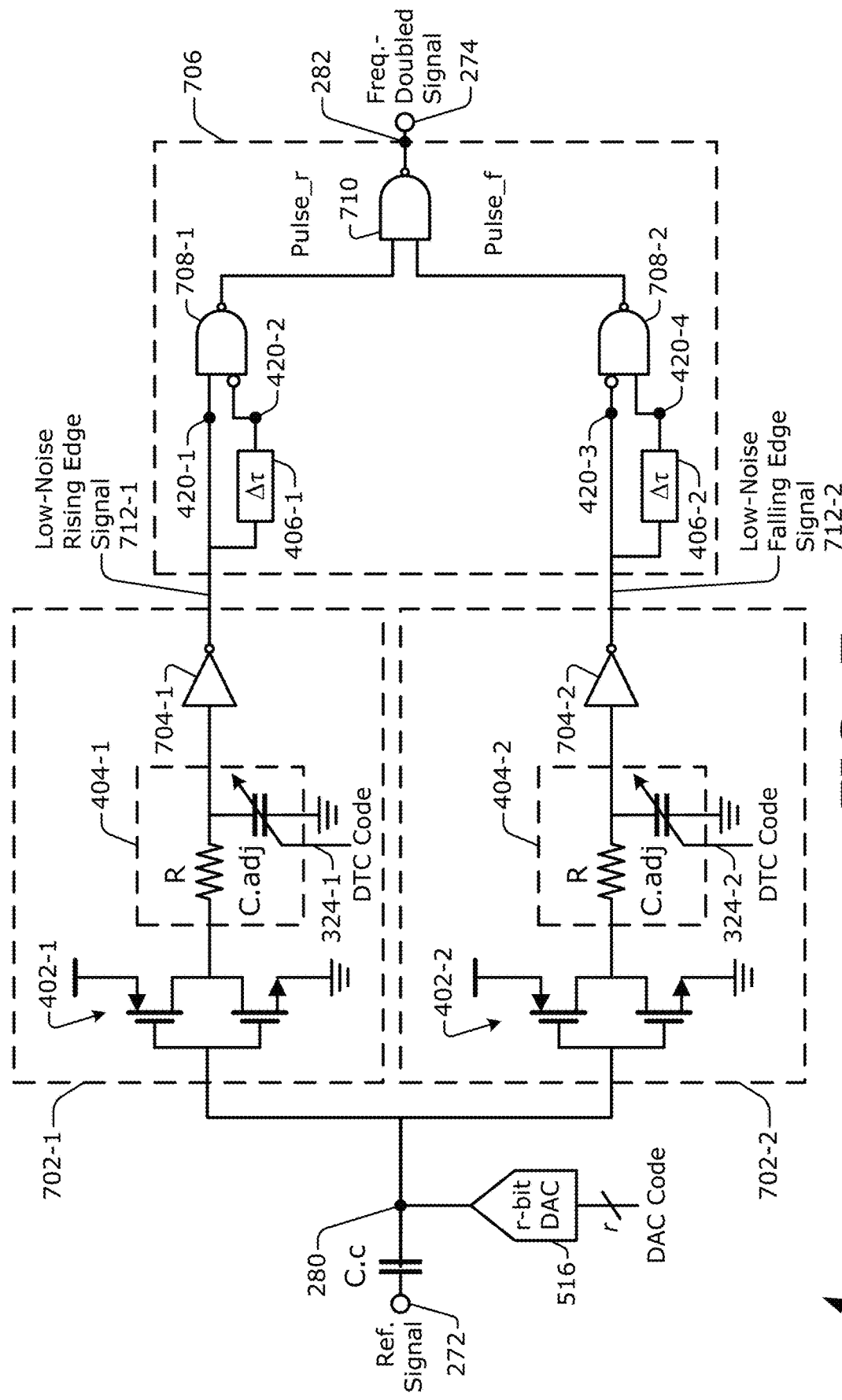
FIG. 7 is a circuit diagram illustrating example components of a frequency doubler core, including those components that operate during a second stage for DCC coarse tuning of the four-stage process for controlling a frequency doubler of FIG. 6.

FIG. 7 is a circuit diagram 700 illustrating example components of a frequency doubler core, including those that can operate during the Stage II of frequency doubler DCC coarse tuning control. The components of the multiple signal pathways 134-1 and 134-2 and the signal combiner 136 (e.g., of FIG. 4) are depicted in FIG. 7 in terms of a first DTC 702-1, a second DTC 702-2, and an edge signal processor 706. Each of the first DTC 702-1 and the second DTC 702-2 can produce a programmable delay based on an edge of the reference signal 272. The first DTC 702-1 provides a rising edge delay with a low-noise rising edge signal 712-1, and the second DTC 702-2 provides a falling edge delay with a low-noise falling edge signal 712-2.

In example implementations, each buffer 402 is realized as an inverter including a p-type metal-oxide-semiconductor (PMOS) transistor (PMOS transistor) and an n-type metal-oxide-semiconductor (NMOS) transistor (NMOS transistor). The transistors of a given inverter may be of different sizes to enable a respective buffer 402 of a respective DTC 702 to "target" a respective edge—e.g., a falling edge or a rising edge. Generally, a falling edge may be gated by the NMOS transistor, and the rising edge may be gated by the PMOS transistor. In some cases, one transistor may be 2 times, 5 times, 10 times, or more times greater than another transistor.

For the first buffer 402-1 of the first DTC 702-1, the inverter includes a relatively strong NMOS transistor and a relatively weak PMOS transistor to produce a low-noise falling edge within the first DTC 702-1. To realize the two transistors, one transistor can be fabricated to be larger than the other. The "strong" transistor can be, for example, approximately an order of magnitude larger (e.g., approximately 8-12× larger) than the "weak" transistor. The first adjustable delay cell 404-1 includes at least one component having an impedance, such as at least a resistor (R) and an adjustable capacitor (C.adj). The adjustable capacitor has an adjustable capacitance with a value that is settable by the first variable delay signal 324-1 using, for instance, at least one DTC code. The adjustable capacitor can be implemented using, for instance, a digitally controlled capacitor bank. The inverter 704-1 transforms the delayed falling edge from the first adjustable delay cell 404-1 into the low-noise rising edge signal 712-1, which is provided to the edge signal processor 706.

For the second buffer 402-2 of the second DTC 702-2, the inverter includes a relatively weak NMOS transistor and a relatively strong PMOS transistor to produce a low-noise rising edge within the second DTC 702-2. To realize the two transistors, one transistor can be fabricated to be larger than the other. The "strong" transistor can be, for example, approximately an order of magnitude larger (e.g., approximately 8-12× larger) than the "weak" transistor. The second adjustable delay cell 404-2 includes at least one component having an impedance, such as at least a resistor (R) and an adjustable capacitor (C.adj). The adjustable capacitor has an adjustable capacitance with a value that is settable by the second variable delay signal 324-2 using, for instance, at least one DTC code. The adjustable capacitor can be implemented using, for instance, a digitally controlled capacitor bank. The inverter 704-2 transforms the delayed rising edge from the second adjustable delay cell 404-2 into the low-noise falling edge signal 712-2, which is provided to the edge signal processor 706.

Each respective inverter 704 may be part of or separate from each respective adjustable delay cell 404. Alternatively or in addition to an adjustable capacitor in each adjustable delay cell 404, each respective resistor thereof may be implemented with an adjustable resistor to change a delay period of the adjustable delay cell 404. Each delay Δτ of each delay cell 406 of the edge signal processor 706 may be set to approximately one-fourth the period of the reference signal 272 after the DLL is locked.

For the edge logic 408 of the signal combiner 136 (both of FIG. 4) of the edge signal processor 706, each respective NAND gate 708-1 and 708-2 may alternatively be part of each respective signal pathway 134-1 and 134-2 (e.g., of FIGS. 3 and 4). Using the respective NAND gate 708, each respective signal pathway can produce a pulse. The first signal pathway 134-1 produces a pulse based on the rising edge (a rising edge pulse or "Pulse_r"), and the second signal pathway 134-2 produces a pulse based on the falling edge (a falling edge pulse or "Pulse_f"). The NAND gate 710 further combines these two pulses to produce the frequency-doubled signal 274 at the doubler output node 282.

Thus, in some implementations, two digital-to-time converters (DTC) 702-1 and 702-2 provide independently pro-grammable delays for the rising and falling edges of the input oscillating signal. A timing error of ±ΔTe can be suppressed by delaying either the rising edge or the falling edge by ΔTe. By using two separate buffers 402-1 and 402-2 with differently sized transistors for the rising and falling edges, respectively, short-circuit current and power consumption can also be reduced. In example operations, the digital DCC loop implemented by the DCC circuitry 304 (e.g., of FIGS. 3 and 4) and the DTCs 702 can initially perform coarse DCC tuning by determining suitable DTC codes to set the adjustable capacitors, as described above for Stage II. Then, for Stage IV (e.g., after Stage III), the DTC codes can remain constant, and the DCC loop can adjust the DAC code of the DAC 516 in the background during runtime periods to correct for the remaining DC error and also errors arising due to PVT variations.

Figure 8:
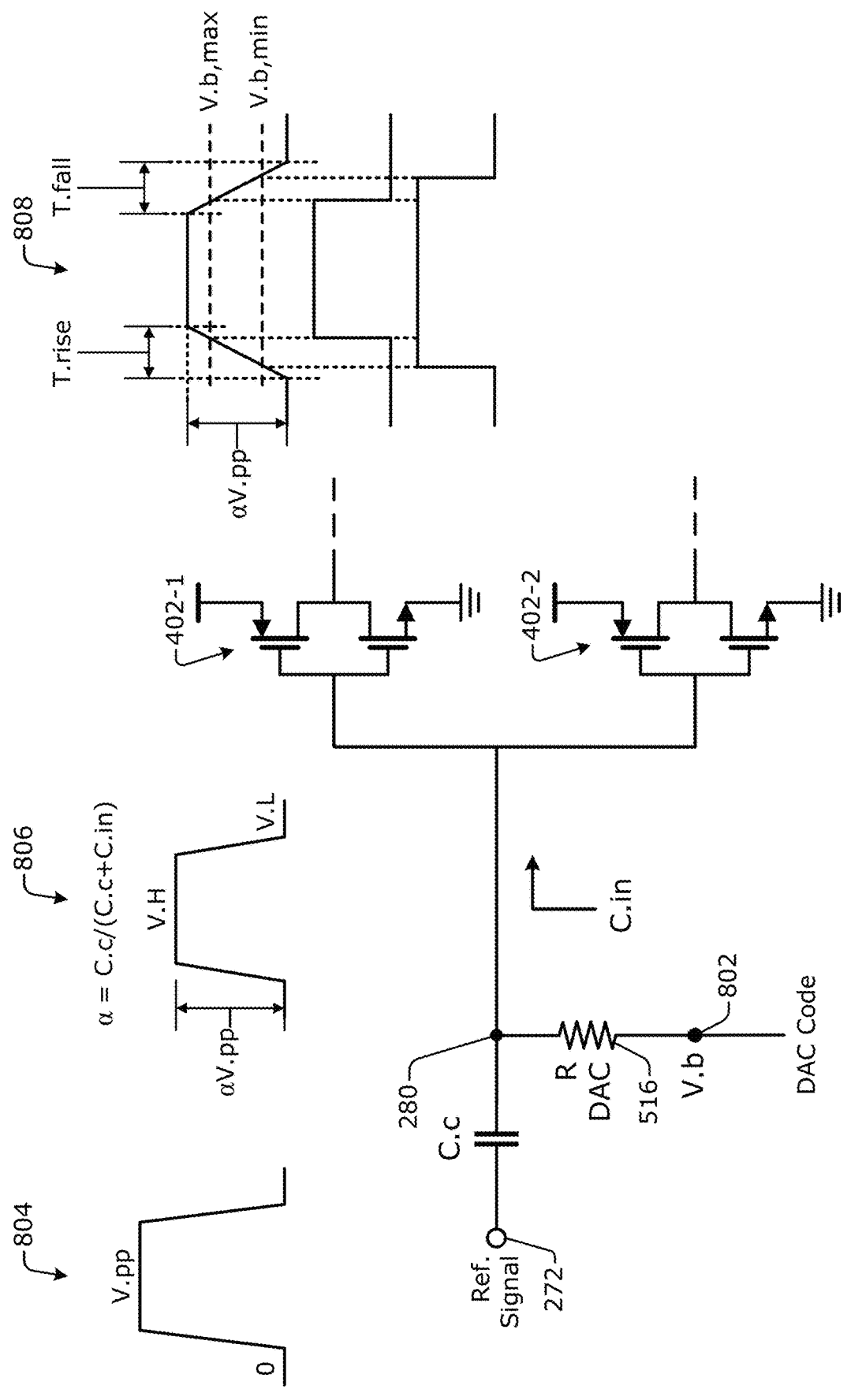
FIG. 8 illustrates example aspects of controlling a frequency doubler including DCC fine tuning during a third or fourth stage of the four-stage process for controlling a frequency doubler of FIG. 6.

FIG. 8 illustrates, at 800 generally, example aspects of controlling a frequency doubler 130, including duty cycle correction fine tuning across Stage III or IV (or both). The fine-tuning DC correction range for Stages III and IV is a function of input signal swing and its rise/fall time (e.g., the slope of signal transitions). The DCC circuitry 304 (e.g., of FIGS. 3 and 5) produces the DC bias voltage Vb at the node 802 based on the DAC code stored in the accumulator 506-3 of the DCC circuitry 304 of FIG. 5. The reference signal 272 has a peak voltage of V.pp as depicted at a graph 804. As shown, the reference signal 272 has non-zero rise and fall times.

In example implementations, regarding the signal that is applied to the frequency doubler 130 at the doubler input node 280, the highest and lowest voltage levels (V.H and V.L) are based on the peak voltage V.pp of the reference signal 272 and a variable α (e.g., αV.pp). The variable α depends on the capacitances of the coupling capacitor and the buffer inputs (C.c and C.in) as shown in relation to a graph 806 for the highest and lowest voltage levels V.H and V.L. A voltage V.H,min is the minimum allowable high voltage level to ensure the relatively larger PMOS transistor of the second buffer 402-2 does not leak. This value may be constrained by: V.H,min<V.b+αV.pp/2. The voltage V.L, max is the maximum allowable low voltage level to ensure the relatively larger NMOS transistor of the first buffer 402-1 does not leak. This value may be constrained by: V.L,max<V.b−αV.pp/2. Thus, the range of the bias voltage Vb can be set based on these minimum and maximum voltage levels, the peak voltage V.pp, and the variable α.

The value of the bias voltage V.b affects a width of the resulting pulse, as indicated at a graph 808. As the bias voltage V.b increases (e.g., from V.b,min to V.b,max), the width of the pulse decreases due to the slope of the reference signal 272 across the rise time T.rise and the fall time T.fall. Thus, as the bias voltage V.b decreases, the width of the pulse increases. In these manners, as the DCC circuitry 304 (e.g., of FIGS. 3 and 5) changes the voltage V.b using the accumulator 506-3 and the duty cycle sensing logic 504, the controller 304 can fine tune the width of the pulse produced by the frequency doubler core 302.

Figure 9:
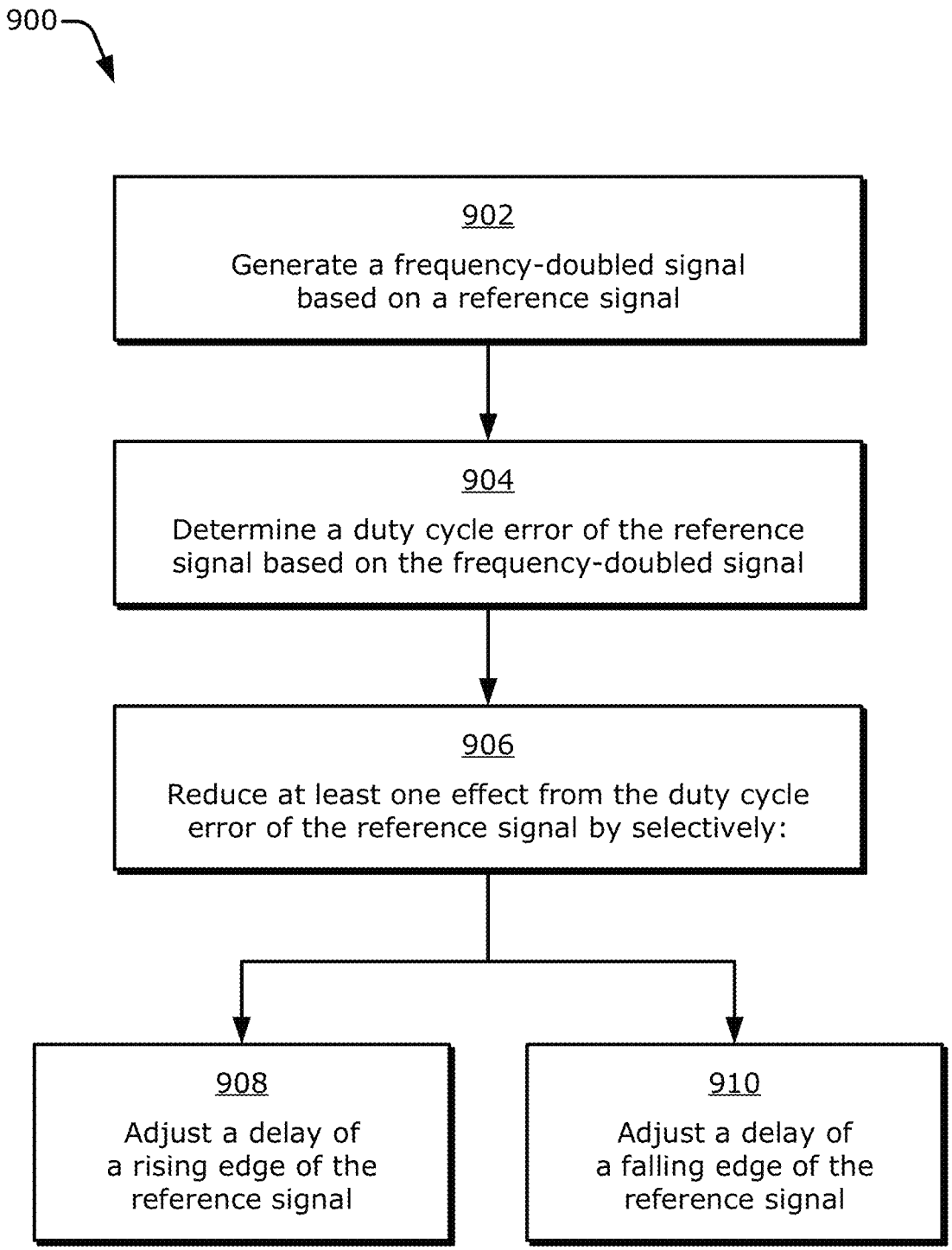
FIG. 9 is a flow diagram illustrating an example process for frequency doubling with duty cycle correction.

FIG. 9 is a flow diagram illustrating an example process 900 for operating a frequency doubler with duty cycle correction. The process 900 is described in the form of a set of blocks 902-910 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900 or an alternative process. Operations represented by the illustrated blocks of the process 900 may be performed by an electronic device 102, including by a wireless interface device 120 thereof. More specifically, the operations of the process 900 may be performed by a frequency doubler 130 that is part of a transceiver 126 or part of other circuitry of an electronic device 102.

At block 902, a frequency doubler is generating a frequency-doubled signal based on a reference signal. For example, a frequency doubler 130 can generate a frequency-doubled signal 274 based on a reference signal 272. In some cases, the frequency doubler 130 may include a frequency doubler core 302 having first and second signal pathways 134-1 and 134-2 that are coupled together substantially in parallel between a doubler input node 280 and a signal combiner 136. Respective ones of the multiple signal pathways 134-1 and 134-2 may be configured to respectively target rising edges or falling edges of the reference signal 272 as described above with reference to FIG. 7.

At block 904, a frequency doubler is determining a duty cycle error of the reference signal based on the frequency-doubled signal. For example, the frequency doubler 130 can determine a duty cycle error, such as an inequality between the high portion and the low portion of each period, in the reference signal 272 based on the frequency-doubled signal 274. For instance, DCC circuitry 304 can sense a duty cycle of the signal or signals using a DLL 330 and a phase detector 308. The phase detector 308 may be shared between the DLL 330 and the DCC circuitry 304. The DLL 330 and the DCC circuitry 304 can operate based on a phase indication signal 320 that is produced by the phase detector 308 based on the frequency-doubled signal 274 and a delayed signal 318, which is output by a delay line 306 of the DLL 330.

At block 906, a frequency doubler is reducing at least one effect from the duty cycle error of the reference signal by selectively adjusting at least one edge of the reference signal. For example, the frequency doubler 130 can reduce at least one effect from the duty cycle error of the reference signal 272 by selectively adjusting a variable delay amount of at least one edge of the reference signal 272. The at least one effect may correspond to a reference spur in an output of an associated locked-loop, such as a PLL 132 that is coupled to an output of the frequency doubler 130. Alternatively or additionally, the at least one effect may correspond to a timing of consecutive rising edges (or falling edges) of the frequency-doubled signal 274. The at least one effect may instead or also correspond to a degree to which even/odd periods of the frequency-doubled signal 274 match each other. Further, the at least one effect may correspond to how much consecutive high portions (or low portions) of the frequency-doubled signal 274 match one another in length. Example effects include decreasing reference spurs, increasing a timing consistency of consecutive edges of a same type, increasing a degree to which even/odd periods match, increasing a degree to which consecutive high/low portions of a same type have matching durations with one other, and so forth.

At block 908, a frequency doubler is adjusting a delay of a rising edge of the reference signal. For example, the frequency doubler 130 can adjust (e.g., increase, decrease, or institute) a delay of a rising edge of the reference signal 272 if the reference signal 272 has a duty cycle that is greater than fifty percent (>50%). To do so, the duty cycle sensing logic 504 may increase or decrease a digital value held in an accumulator 506-1 that controls, at least partially, a first variable delay signal 324-1 that is coupled to a first adjustable delay cell 404-1 of the first signal pathway 134-1. At block 910, a frequency doubler is adjusting a delay of a falling edge of the reference signal. For example, the frequency doubler 130 can adjust a delay of a falling edge of the reference signal 272 if the reference signal 272 has a duty cycle that is less than fifty percent (<50%). The duty cycle sensing logic 504 may also increase or decrease another digital value held in an accumulator 506-2 that controls, at least partially, a second variable delay signal 324-2 that is coupled to a second adjustable delay cell 404-2 of the second signal pathway 134-2.

The following section describes some aspects of example implementations and/or example configurations related to the apparatuses and processes presented above.

Example aspect 1: An apparatus comprising:
    a frequency doubler comprising:
        a signal combiner coupled to a doubler output node;
        a first signal pathway coupled between a doubler input node and the signal combiner, the first signal pathway comprising a first adjustable delay cell; and
        a second signal pathway coupled between the doubler input node and the signal combiner, the second signal pathway comprising a second adjustable delay cell.

Example aspect 2: The apparatus of example aspect 1, wherein:
    the first signal pathway corresponds to a rising edge of a signal; and
    the second signal pathway corresponds to a falling edge of the signal.

Example aspect 3: The apparatus of example aspect 2, wherein the frequency doubler comprises a controller configured to at least one of:
    adjust the first adjustable delay cell to program a delay for rising edges of the signal; or
    adjust the second adjustable delay cell to program a delay for falling edges of the signal.

Example aspect 4: The apparatus of example aspect 2, wherein:
    the signal comprises a reference signal; and
    the frequency doubler comprises duty cycle correction circuitry configured to selectively:
        delay rising edges of the reference signal responsive to a duty cycle of the reference signal comprising greater than fifty percent (>50%); or
        delay falling edges of the reference signal responsive to the duty cycle of the reference signal comprising less than fifty percent (<50%).

Example aspect 5: The apparatus of example aspect 1 or any one of the other preceding example aspects, wherein:
    the first adjustable delay cell comprises a first resistor coupled to a first adjustable capacitor; and
    the second adjustable delay cell comprises a second resistor coupled to a second adjustable capacitor.

Example aspect 6: The apparatus of example aspect 5, wherein the frequency doubler comprises duty cycle correction circuitry configured to at least one of:
    change a capacitance of the first adjustable capacitor based on a duty cycle of a reference signal; or
    change a capacitance of the second adjustable capacitor based on the duty cycle of the reference signal.

Example aspect 7: The apparatus of example aspect 1 or any one of the other preceding example aspects, wherein:
    the first signal pathway comprises a first buffer and a first delay cell that are coupled to the first adjustable delay cell; and
    the second signal pathway comprises a second buffer and a second delay cell that are coupled to the second adjustable delay cell.

Example aspect 8: The apparatus of example aspect 7, wherein:

the first buffer comprises a first p-type metal-oxide-semiconductor (PMOS) transistor coupled to a first n-type metal-oxide-semiconductor (NMOS) transistor, the first NMOS transistor larger than the first PMOS transistor; and the second buffer comprises a second PMOS transistor coupled to a second NMOS transistor, the second PMOS transistor larger than the second NMOS transistor.

Example aspect 9: The apparatus of example aspect 7 or example aspect 8, wherein:

the signal combiner comprises gate logic;

the first buffer and the first adjustable delay cell are coupled together in series between the doubler input node and a first input of the gate logic;

the first buffer, the first adjustable delay cell, and the first delay cell are coupled together in series between the doubler input node and a second input of the gate logic;

the second buffer and the second adjustable delay cell are coupled together in series between the doubler input node and a third input of the gate logic; and the second buffer, the second adjustable delay cell, and the second delay cell are coupled together in series between the doubler input node and a fourth input of the gate logic.

Example aspect 10: The apparatus of example aspect 9, wherein the gate logic is configured to combine a rising-edge pulse obtained via the first signal pathway and a falling-edge pulse obtained via the second signal pathway.

Example aspect 11: The apparatus of example aspect 1 or any one of the other preceding example aspects, wherein:

the frequency doubler comprises a frequency doubler core that comprises the signal combiner, the first signal pathway, and the second signal pathway; and the frequency doubler comprises a delay-locked loop (DLL) coupled to the doubler output node.

Example aspect 12: The apparatus of example aspect 11, wherein the DLL comprises:

a delay line having an input node, an output node, and a tuning control node, the input node coupled to the doubler output node; and a DLL control loop path coupled between the output node and the tuning control node.

Example aspect 13: The apparatus of example aspect 12, wherein:

the frequency doubler comprises a phase detector coupled to the output node of the delay line and to the doubler output node; and the phase detector is coupled between the output node of the delay line and an input of the DLL control loop path.

Example aspect 14: The apparatus of example aspect 13, wherein the phase detector comprises a bang-bang phase detector (BBPD).

Example aspect 15: The apparatus of example aspect 13 or example aspect 14, wherein:

the frequency doubler comprises duty cycle correction (DCC) circuitry; and the DCC circuitry is coupled between an output of the phase detector and the frequency doubler core.

Example aspect 16: The apparatus of example aspect 1, wherein the frequency doubler comprises:

a phase detector having an output node and at least one input node coupled to the doubler output node; and duty cycle correction (DCC) circuitry coupled between the output node of the phase detector and the doubler input node.

Example aspect 17: The apparatus of example aspect 16, wherein the DCC circuitry is configured to provide a bias voltage signal for the doubler input node to change a width of a pulse produced by the frequency doubler at the doubler output node.

Example aspect 18: The apparatus of example aspect 17, wherein the DCC circuitry is configured to establish a direct-current (DC) bias voltage at the doubler input node using the bias voltage signal based on a frequency-doubled signal produced by the frequency doubler at the doubler output node.

Example aspect 19: The apparatus of example aspect 17 or example aspect 18, wherein the DCC circuitry is configured to:

adjust the first adjustable delay cell and the second adjustable delay cell for coarse tuning during an initialization period; and change the width of the pulse for fine tuning during a runtime period.

Example aspect 20: The apparatus of example aspect 1 or any one of the other preceding example aspects, further comprising:

a phase-locked loop (PLL) including a PLL input node that is coupled to the doubler output node, wherein:

the doubler input node is coupled to a reference signal source;

the reference signal source comprises a crystal oscillator configured to generate a reference signal having a reference frequency; and the frequency doubler is configured to produce a frequency-doubled signal based on the reference signal, the frequency-doubled signal having a frequency that is approximately twice the reference frequency.

Example aspect 21: The apparatus of example aspect 1 or any one of the other preceding example aspects, further comprising:

at least one antenna; and a wireless interface device coupled to the at least one antenna, the wireless interface device comprising the frequency doubler.

Example aspect 22: The apparatus of example aspect 21, further comprising:

a display screen; and at least one processor operatively coupled to the display screen and at least a portion of the wireless interface device, the at least one processor configured to present one or more graphical images on the display screen based on one or more wireless signals communicated via the at least one antenna using the frequency doubler of the wireless interface device.

Example aspect 23: An apparatus for doubling a reference frequency of a reference signal, the apparatus comprising:

a frequency doubler comprising:

first means for selectively delaying a rising edge of the reference signal and for producing a rising edge signal;

second means for selectively delaying a falling edge of the reference signal and for producing a falling edge signal; and combination means for combining the rising edge signal and the falling edge signal to produce a signal having a frequency approximately double the reference frequency.

Example aspect 24: The apparatus of example aspect 23, wherein the first means comprises:

means for buffering the reference signal to produce a buffered reference signal; and means for adjusting a length of a delay of the rising edge of the buffered reference signal.

Example aspect 25: The apparatus of example aspect 24, further comprising:

means for establishing a direct-current bias voltage for the means for buffering based on a duty cycle of the reference signal.

Example aspect 26: A method for operating a frequency doubler with duty cycle correction, the method comprising:
generating a frequency-doubled signal based on a reference signal;
determining a duty cycle error of the reference signal based on the frequency-doubled signal; and
reducing at least one effect from the duty cycle error of the reference signal by selectively:
adjusting a delay of a rising edge of the reference signal; or adjusting a delay of a falling edge of the reference signal.

Example aspect 27: The method of example aspect 26, wherein the determining comprises:
determining a phase indication signal based on the frequency-doubled signal; and
sensing a duty cycle of the phase indication signal to produce a sensed duty cycle signal.

Example aspect 28: The method of example aspect 27, wherein the reducing comprises:
changing a digital value in at least one up/down counter based on the sensed duty cycle signal; and
coupling the digital value to at least one component of the frequency doubler to adjust an impedance of the at least one component.

Example aspect 29: The method of example aspect 26 or either of example aspect 27 or 28, further comprising:
adjusting a direct-current (DC) bias voltage for two or more buffers of the frequency doubler to change a width of a pulse used to generate the frequency-doubled signal.

Example aspect 30: An apparatus comprising:
a frequency doubler comprising:
a frequency doubler core comprising at least one adjustable delay cell;
a delay-locked loop (DLL) coupled to the frequency doubler core;
a controller circuit coupled to the at least one adjustable delay cell; and
a phase detector, a first input of the phase detector coupled to the frequency doubler core, a second input of the phase detector coupled to the DLL, and an output of the phase detector coupled to an input of the DLL and an input of the controller circuit.

Example aspect 31: The apparatus of example aspect 30, wherein:
the DLL comprises:
a delay line; and
a DLL control loop path coupled to the delay line;
the input of the DLL corresponds to an input of the DLL control loop path;
the phase detector comprises part of the DLL;
the second input of the phase detector is coupled to an output of the delay line; and
the output of the phase detector is coupled to the input of the DLL control loop path.

Example aspect 32: The apparatus of example aspect 30 or example aspect 31, wherein:
the controller comprises duty cycle correction (DCC) circuitry coupled to at least one control input of the at least one adjustable delay cell, the DCC circuitry configured to adjust at least one delay of at least one edge produced by the at least one adjustable delay cell; and
the input of the controller circuit comprises or is coupled to an input of the DCC circuitry.

Example aspect 33: The apparatus of example aspect 30 or either of example aspect 31 or 32, wherein:
the at least one adjustable delay cell comprises a first adjustable delay cell and a second adjustable delay cell; and
the frequency doubler core comprises:
a first signal pathway coupled between an input and an output of the frequency doubler core and corresponding to a rising edge of a signal, the first signal pathway comprising the first adjustable delay cell; and
a second signal pathway coupled between the input and the output of the frequency doubler core and corresponding to a falling edge of the signal, the second signal pathway comprising the second adjustable delay cell.

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first signal pathway" or a "first adjustable delay cell" in one context may be identified as a "second signal pathway" or a "second adjustable delay cell," respectively, in another context. Similarly, a "first input" in one claim may be recited as a "second input" in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a frequency doubler comprising:
a signal combiner coupled to a doubler output node;

a first signal pathway coupled between a doubler input node and the signal combiner, the first signal pathway comprising a first adjustable delay cell, a first buffer that is coupled to the first adjustable delay cell, and a first delay cell that is coupled to the first adjustable delay cell; the first buffer comprising a first p-type metal-oxide-semiconductor (PMOS) transistor coupled to a first n-type metal-oxide-semiconductor (NMOS) transistor, the first NMOS transistor larger than the first PMOS transistor; and a second signal pathway coupled between the doubler input node and the signal combiner, the second signal pathway comprising a second adjustable delay cell, a second buffer that is coupled to the second adjustable delay cell, and a second delay cell that is coupled to the second adjustable delay cell; the second buffer comprising a second PMOS transistor coupled to a second NMOS transistor, the second PMOS transistor larger than the second NMOS transistor.

2. The apparatus of claim 1, wherein:
the first signal pathway corresponds to a rising edge of a signal; and
the second signal pathway corresponds to a falling edge of the signal.

3. The apparatus of claim 2, wherein the frequency doubler comprises a controller circuit configured to at least one of:
adjust the first adjustable delay cell to program a delay for rising edges of the signal; or
adjust the second adjustable delay cell to program a delay for falling edges of the signal.

4. The apparatus of claim 2, wherein:
the signal comprises a reference signal; and
the frequency doubler comprises duty cycle correction circuitry configured to selectively:
delay rising edges of the reference signal responsive to a duty cycle of the reference signal comprising greater than fifty percent (>50%); or
delay falling edges of the reference signal responsive to the duty cycle of the reference signal comprising less than fifty percent (<50%).

5. The apparatus of claim 1, wherein:
the first adjustable delay cell comprises a first resistor coupled to a first adjustable capacitor; and
the second adjustable delay cell comprises a second resistor coupled to a second adjustable capacitor.

6. The apparatus of claim 5, wherein the frequency doubler comprises duty cycle correction circuitry configured to at least one of:
change a capacitance of the first adjustable capacitor based on a duty cycle of a reference signal; or
change a capacitance of the second adjustable capacitor based on the duty cycle of the reference signal.

7. The apparatus of claim 1, wherein:
the signal combiner comprises gate logic;
the first buffer and the first adjustable delay cell are coupled together in series between the doubler input node and a first input of the gate logic;
the first buffer, the first adjustable delay cell, and the first delay cell are coupled together in series between the doubler input node and a second input of the gate logic;
the second buffer and the second adjustable delay cell are coupled together in series between the doubler input node and a third input of the gate logic; and
the second buffer, the second adjustable delay cell, and the second delay cell are coupled together in series between the doubler input node and a fourth input of the gate logic.

8. The apparatus of claim 1, wherein:
the frequency doubler comprises a frequency doubler core that comprises the signal combiner, the first signal pathway, and the second signal pathway; and
the frequency doubler comprises a delay-locked loop (DLL) coupled to the doubler output node.

9. The apparatus of claim 8, wherein the DLL comprises:
a delay line having an input node, an output node, and a tuning control node, the input node coupled to the doubler output node; and
a DLL control loop path coupled between the output node and the tuning control node.

10. The apparatus of claim 9, wherein:
the frequency doubler comprises a phase detector coupled to the output node of the delay line and to the doubler output node; and
the phase detector is coupled between the output node of the delay line and an input of the DLL control loop path.

11. The apparatus of claim 10, wherein:
the frequency doubler comprises duty cycle correction (DCC) circuitry; and
the DCC circuitry is coupled between an output of the phase detector and the frequency doubler core.

12. The apparatus of claim 1, wherein the frequency doubler comprises:
a phase detector having an output node and at least one input node coupled to the doubler output node; and
duty cycle correction (DCC) circuitry coupled between the output node of the phase detector and the doubler input node.

13. The apparatus of claim 12, wherein the DCC circuitry is configured to provide a bias voltage signal for the doubler input node to change a width of a pulse produced by the frequency doubler at the doubler output node.

14. The apparatus of claim 13, wherein the DCC circuitry is configured to establish a direct-current (DC) bias voltage at the doubler input node using the bias voltage signal based on a frequency-doubled signal produced by the frequency doubler at the doubler output node.

15. The apparatus of claim 13, wherein the DCC circuitry is configured to:
adjust the first adjustable delay cell and the second adjustable delay cell for coarse tuning during an initialization period; and
change the width of the pulse for fine tuning during a runtime period.

16. The apparatus of claim 1, further comprising:
a phase-locked loop (PLL) including a PLL input node that is coupled to the doubler output node, wherein:
the doubler input node is coupled to a reference signal source;
the reference signal source comprises a crystal oscillator configured to generate a reference signal having a reference frequency; and
the frequency doubler is configured to produce a frequency-doubled signal based on the reference signal, the frequency-doubled signal having a frequency that is approximately twice the reference frequency.

17. The apparatus of claim 1, further comprising:
at least one antenna; and
a wireless interface device coupled to the at least one antenna, the wireless interface device comprising the frequency doubler.

18. A method for operating a frequency doubler with duty cycle correction, the method comprising:
generating a frequency-doubled signal based on a reference signal;
determining a duty cycle error of the reference signal based on the frequency-doubled signal, including:
determining a phase indication signal based on the frequency-doubled signal; and
sensing a duty cycle of the phase indication signal to produce a sensed duty cycle signal; and
reducing at least one effect from the duty cycle error of the reference signal by selectively:
adjusting a delay of a rising edge of the reference signal; or
adjusting a delay of a falling edge of the reference signal,
the reducing including:
changing a digital value in at least one up/down counter based on the sensed duty cycle signal; and
coupling the digital value to at least one component of the frequency doubler to adjust an impedance of the at least one component.

19. The method of claim 18, further comprising:
adjusting a direct-current (DC) bias voltage for two or more buffers of the frequency doubler to change a width of a pulse used to generate the frequency-doubled signal.

20. An apparatus comprising:
a frequency doubler comprising:
a signal combiner comprising gate logic and coupled to a doubler output node;
a first signal pathway coupled between a doubler input node and the signal combiner, the first signal pathway comprising a first adjustable delay cell, a first buffer that is coupled to the first adjustable delay cell, and a first delay cell that is coupled to the first adjustable delay cell; and
a second signal pathway coupled between the doubler input node and the signal combiner, the second signal pathway comprising a second adjustable delay cell, a second buffer that is coupled to the second adjustable delay cell, and a second delay cell that is coupled to the second adjustable delay cell,
the first buffer and the first adjustable delay cell coupled together in series between the doubler input node and a first input of the gate logic;
the first buffer, the first adjustable delay cell, and the first delay cell coupled together in series between the doubler input node and a second input of the gate logic;
the second buffer and the second adjustable delay cell coupled together in series between the doubler input node and a third input of the gate logic; and
the second buffer, the second adjustable delay cell, and the second delay cell coupled together in series between the doubler input node and a fourth input of the gate logic.

21. The apparatus of claim 20, wherein the frequency doubler comprises:
a frequency doubler core comprising the signal combiner, the first signal pathway, and the second signal pathway;
a delay-locked loop (DLL) coupled to the frequency doubler core;
a controller circuit coupled to at least one of the first adjustable delay cell or the second adjustable delay cell; and
a phase detector, a first input of the phase detector coupled to the frequency doubler core, a second input of the phase detector coupled to the DLL, and an output of the phase detector coupled to an input of the DLL and an input of the controller circuit.

22. The apparatus of claim 21, wherein:
the DLL comprises:
a delay line; and
a DLL control loop path coupled to the delay line;
the input of the DLL corresponds to an input of the DLL control loop path;
the phase detector comprises part of the DLL;
the second input of the phase detector is coupled to an output of the delay line; and
the output of the phase detector is coupled to the input of the DLL control loop path.

23. The apparatus of claim 21, wherein:
the controller circuit comprises duty cycle correction (DCC) circuitry coupled to at least one control input of at least one of the first adjustable delay cell or the second adjustable delay cell, the DCC circuitry configured to adjust at least one delay of at least one edge produced by at least one of the first adjustable delay cell or the second adjustable delay cell; and
the input of the controller circuit comprises or is coupled to an input of the DCC circuitry.

24. The apparatus of claim 21, wherein:
the first signal pathway is coupled between an input and an output of the frequency doubler core and corresponds to a rising edge of a signal; and
the second signal pathway is coupled between the input and the output of the frequency doubler core and corresponds to a falling edge of the signal.

25. An apparatus comprising:
a frequency doubler comprising:
a signal combiner coupled to a doubler output node;
a first signal pathway coupled between a doubler input node and the signal combiner, the first signal pathway comprising a first adjustable delay cell;
a second signal pathway coupled between the doubler input node and the signal combiner, the second signal pathway comprising a second adjustable delay cell; and
a controller circuit coupled between the doubler output node and the first adjustable delay cell and between the doubler output node and the second adjustable delay cell, the controller circuit comprising:
a first accumulator configured to provide a first variable delay signal to the first adjustable delay cell; and
a second accumulator configured to provide a second variable delay signal to the second adjustable delay cell, the first variable delay signal and the second variable delay signal having different values.

26. The apparatus of claim 25, wherein the controller circuit is configured to at least one of:
adjust the first adjustable delay cell to program a delay for rising edges of a signal based on the first variable delay signal; or
adjust the second adjustable delay cell to program a delay for falling edges of the signal based on the second variable delay signal.

27. The apparatus of claim 26, wherein:

the signal comprises a reference signal; and the controller circuit comprises duty cycle correction circuitry configured to selectively:

delay rising edges of the reference signal responsive to a duty cycle of the reference signal comprising greater than fifty percent (>50%); or delay falling edges of the reference signal responsive to the duty cycle of the reference signal comprising less than fifty percent (<50%).

28. The apparatus of claim 26, wherein the controller circuit comprises:

a first flip-flop that is triggered responsive to a rising edge of a first signal; and a second flip-flop that is triggered responsive to a falling edge of a second signal.

29. The apparatus of claim 25, wherein the frequency doubler comprises:

a delay-locked loop (DLL) coupled between the signal combiner and the controller circuit; and a phase detector coupled between the signal combiner and the controller circuit and between the DLL and the controller circuit.

30. The apparatus of claim 25, wherein:

the first variable delay signal comprises a first digital code that is based on the first accumulator; and the second variable delay signal comprises a second digital code that is based on the second accumulator.

\* \* \* \* \*